(12) United States Patent
Ishibashi

(10) Patent No.: US 9,953,937 B2
(45) Date of Patent: Apr. 24, 2018

(54) ELECTRONIC DEVICE AND METHOD OF PRODUCING THE SAME

(71) Applicant: FUJITSU LIMITED, Kawasaki-shi, Kanagawa (JP)

(72) Inventor: Daijiro Ishibashi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/097,517

(22) Filed: Apr. 13, 2016

(65) Prior Publication Data

US 2016/0351729 A1    Dec. 1, 2016

(30) Foreign Application Priority Data

May 27, 2015  (JP) ................................. 2015-107001

(51) Int. Cl.
| H01L 23/552 | (2006.01) |
| H01L 23/66 | (2006.01) |
| H01L 23/00 | (2006.01) |
| H01L 21/56 | (2006.01) |

(52) U.S. Cl.
CPC .............. *H01L 23/66* (2013.01); *H01L 24/19* (2013.01); *H01L 24/96* (2013.01); *H01L 21/568* (2013.01); *H01L 2223/6677* (2013.01); *H01L 2224/04105* (2013.01); *H01L 2924/19105* (2013.01)

(58) Field of Classification Search
CPC ...................................................... H01L 23/552
See application file for complete search history.

(56) References Cited

U.S. PATENT DOCUMENTS

| 2007/0013581 A1 | 1/2007 | Iijima | |
| 2010/0073255 A1* | 3/2010 | Noll | H01Q 1/40 343/873 |
| 2010/0230789 A1* | 9/2010 | Yorita | H01L 23/3121 257/659 |
| 2011/0181488 A1* | 7/2011 | Tang | H01Q 1/2283 343/873 |

FOREIGN PATENT DOCUMENTS

| JP | 2002-100725 A1 | 4/2002 |
| JP | 2006-261767 A1 | 9/2006 |

* cited by examiner

*Primary Examiner* — Peniel M Gumedzoe
*Assistant Examiner* — Christopher Johnson
(74) *Attorney, Agent, or Firm* — Kratz, Quintos & Hanson, LLP

(57) ABSTRACT

An electronic device includes a structure including a first resin layer, an electronic component buried in the first resin layer, a reflector element for antenna disposed on the first resin layer, and an insulating layer disposed on the reflector element; a semiconductor device; a second resin layer in which the structure and the semiconductor device are buried; and a radiating element of the antenna, the radiating element being disposed on the insulating layer and electrically coupled the semiconductor device.

7 Claims, 32 Drawing Sheets

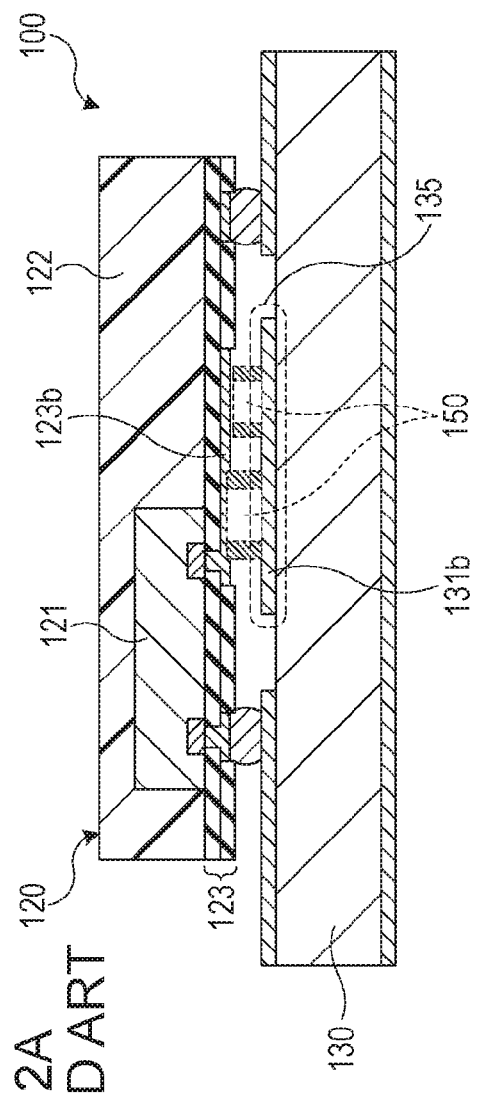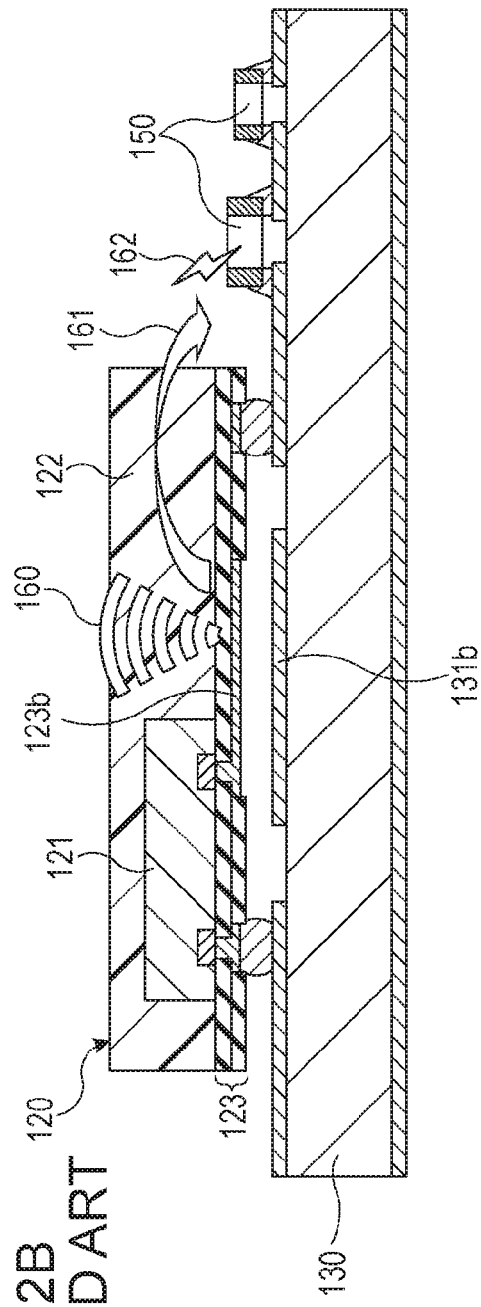

ELECTRONIC DEVICE AND METHOD OF PRODUCING THE SAME

CROSS-REFERENCE TO RELATED APPLICATION

This application is based upon and claims the benefit of priority of the prior Japanese Patent Application No. 2015-107001, filed on May 27, 2015, the entire contents of which are incorporated herein by reference.

FIELD

The embodiments discussed herein are related to an electronic device and a method of producing the electronic device.

BACKGROUND

It has been common practice to bury electronic components such as an integrated circuit (IC) chip, a capacitor, and a filter in a resin layer. In addition, it has been common practice to dispose a conductive pattern or a conductive pattern having a portion serving as an antenna on the resin layer having the buried electronic components so as to be electrically connected to the electronic components.

Such a technology is disclosed in Japanese Laid-open Patent Publication No. 2002-100725, for example.

SUMMARY

According to an aspect of the invention, an electronic device includes a structure including a first resin layer, an electronic component buried in the first resin layer, a reflector element for antenna disposed on the first resin layer, and an insulating layer disposed on the reflector element; a semiconductor device; a second resin layer in which the structure and the semiconductor device are buried; and a radiating element of the antenna, the radiating element being disposed on the insulating layer and electrically coupled the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are views for explaining a problem caused by chip parts mounted on a circuit board;

DESCRIPTION OF EMBODIMENTS

There is a case in which a module including an electrical conductor including a radiating element of antenna provided on a resin layer which includes a buried electronic component may be mounted on a circuit board. In such a case, a reflector is disposed on the circuit board so as to face the radiating element of the module. When it is required to arrange additionally another electronic component on the circuit board, mounting area for the another electronic component is positioned away from the module on the circuit board, because the another electronic component is difficult to be arranged at an area occupied by the reflector.

Accordingly, when the mounting area of the electronic component in addition to the module is provided on the circuit board, the area of the circuit board increases. When the electronic component is positioned close to the module to reduce the increase in the area of the circuit board, the electronic component may be subjected to radiation from the antenna of the module, causing noise in a circuit including the electronic component.

Figure 1:
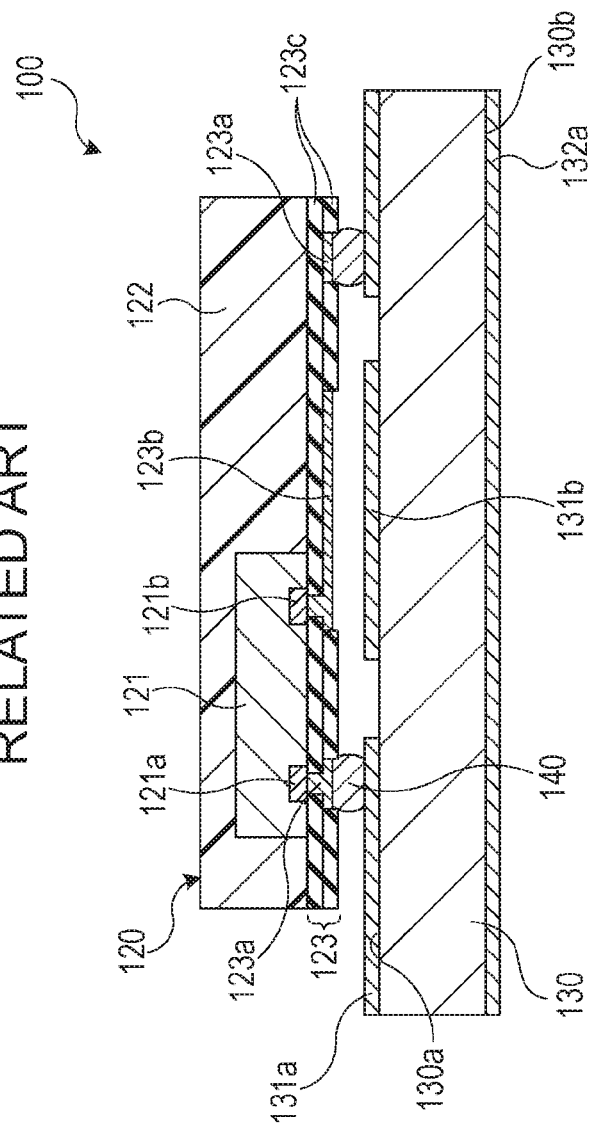
FIG. 1 is a view illustrating a configuration of an electronic device.

A configuration of an electronic device is described. FIG. 1 is a view illustrating the configuration of the electronic device. In FIG. 1, a main portion of the electronic device is schematically illustrated in cross section.

An electronic device 100 illustrated in FIG. 1 includes a module 120 (electronic device) and a circuit board 130 on which the module 120 is mounted. The module 120 includes a semiconductor chip 121 (semiconductor device), a resin layer 122 in which the semiconductor chip 121 is buried, and a wiring layer 123 disposed on the resin layer 122.

The semiconductor chip 121 includes terminals 121a and 121b. The semiconductor chip 121 is buried in the resin layer 122 such that the terminals 121a and 121b are exposed. The structure in which the semiconductor chip 121 is buried in the resin layer 122 is formed by using technique of molding or wafer level packaging (WLP), for example.

The wiring layer 123 includes a conductive pattern 123a, a radiating element 123b, and an insulating layer 123c. A portion of the conductive pattern 123a and the radiating element 123b are exposed on the insulating layer 123c. The wiring layer 123 is formed by using photolithography, a film formation technique for a conductor and an insulator, or etching, for example.

A portion of the conductive pattern 123a of the wiring layer 123 is electrically connected to the terminal 121a of the semiconductor chip 121. The radiating element 123b of the wiring layer 123, which is electrically connected to the terminal 121b of the semiconductor chip 121, functions as an antenna. The semiconductor chip 121 includes a transmitting circuit, a receiving circuit, or a transmitting and receiving circuit, for example. A signal from the semiconductor chip 121 is transmitted to outside of the electronic device 100 through the radiating element 123b, or a signal from outside of the electronic device 100 is received by the semiconductor chip 121 through the radiating element 123b.

The module 120 having the above-described configuration is mounted on the circuit board 130 and electrically connected to the circuit board 130 through the conductive pattern 123a of the wiring layer 123. The circuit board 130 is a printed wiring board, for example. The circuit board 130 includes a conductive pattern 131a on a surface 130a. The conductive pattern 131a is electrically connected to a conductive pattern such as a wiring or a through hole in the circuit board 130. The circuit board 130 may include a conductive pattern 132a on a surface 130b opposite the surface 130a. The conductive pattern 131a on the surface 130a of the circuit board 130 is connected to the conductive pattern 123a on the wiring layer 123 of the module 120 with a piece of solder 140 such that the circuit board 130 and the module 120 are electrically connected.

A reflector element 131b for an antenna is disposed on the surface 130a of the circuit board 130 so as to face the radiating element 123b of the module 120, which is connected to the circuit board 130. The reflector element 131b reflects the signal, which is radiated from the radiating element 123b to the side of the reflector element 131b, toward the radiating element 123b. The reflector element 131b reduces the possibility that a signal radiated from the radiating element 123b toward the side of the reflector element 131b will enter the circuit board 130 or the possibility that a signal from in the circuit board 130 will enter the radiating element 123b, for example.

In the electronic device 100, a signal transmission line connecting the semiconductor chip 121 and the radiating element 123b to each other does not include a soldered portion, and the signal transmission line is relatively short. In some electronic devices, the semiconductor chip and the radiator are connected by a signal transmission line which includes a soldered portion or has a relatively long length. In such a case, reflection due to impedance mismatch at the soldered portion or loss in the signal transmission line may occur. The reflection and the loss are more likely to occur in an ultra-high frequency range of a millimeter-wave frequency (30 GHz to 300 GHz) or a terahertz frequency (300 GHz to 3 THz). Accordingly, it is regarded preferable that high-frequency signal processing unit in electrical devices includes a short signal transmission line or no soldered portion.

A chip part (electronic component) is further mounted on the circuit board 130 of the electronic device 100. For example, a capacitor as a bypass capacitor may be mounted on the circuit board 130 for stabilizing a circuit including the module 120 and the circuit board 130. Other chip part such as a resistor, a coil, or the like may be mounted on the circuit board 130. However, the problem illustrated in FIGS. 2A and 2B may occur when such chip part is mounted on the circuit board 130 together with the module 120.

In the electronic device 100, there is adopted a configuration in which the semiconductor chip 121 and the radiating element 123b are connected by the relatively short signal transmission line, which does not include the soldered portion. Thus, the reflection or the loss occurred in the high-frequency signal transmission is reduced.

The circuit board 130 of the above electronic device 100 may include a chip part or an electronic component. A circuit including the module 120 and the circuit board 130 may include a capacitor (bypass capacitor) to stabilize the circuit board 130. A chip part such as a resistor and a coil may be mounted on the circuit board 130. However, the problem illustrated in FIGS. 2A and 2B may occur when the chip part is mounted on the circuit board 130 together with the module 120.

FIG. 2A and FIG. 2B are views for explaining a problem caused by chip parts mounted on the circuit board 130. FIGS. 2A and 2B illustrate schematic cross-sectional views of an important portion of the electronic device. In the above-described electronic device 100, the reflector element 131b is disposed on the circuit board 130 so as to face the radiating element 123b of the module 120. Thus, as illustrated in FIG. 2A, it is difficult to mount chip parts 150 on the circuit board 130 over a mounting area 135 for the reflector element 131b. In FIG. 2A, the chip parts 150 are indicated by a dotted line for ease of explanation. When a high-gain antenna is used, the radiating element 123b has a relatively large planar area of a 5 cm by 5 cm square, for example, which leads to an increase in the mounting area 135 for the reflector element 131b. Accordingly, the area of the circuit board 130 over which the chip parts 150 are not mounted increases.

Since the chip parts 150 are unable to be mounted on the circuit board 130 over the mounting area 135 for the reflector element 131b, the chip parts 150 are mounted on the circuit board 130 at a position away from the module 120 as illustrated in FIG. 2B. However, when the chip parts 150 are mounted on the circuit board 130 at the position away from the module 120, the area of the circuit board 130 increases at least by the mounting area for the chip parts 150. This leads to an increase in the size of the electronic device.

When the chip parts 150 are positioned as close as possible to the module 120 for reducing the increase in the area of the circuit board 130, the chip part 150 may be subject to influence of radiation 160 from the radiating element 123b of the module 120. When the chip parts 150 receive a portion 161 of the radiation 160 radiated from the radiating element 123b, noise 162 may be generated in the circuit including the module 120, the circuit board 130, and the chip part 150. For reducing the noise 162, the chip parts 150 may be positioned as far as possible from the radiating element 123b of the module 120, however, such positioning increases the area of the circuit board 130 to result in an increase in size of the electronic device.

In view of the above, technology described in the following embodiments is employed to reduce the size of the electronic device including an antenna and to reduce the generation of noise in the electronic device.

Figure 3:
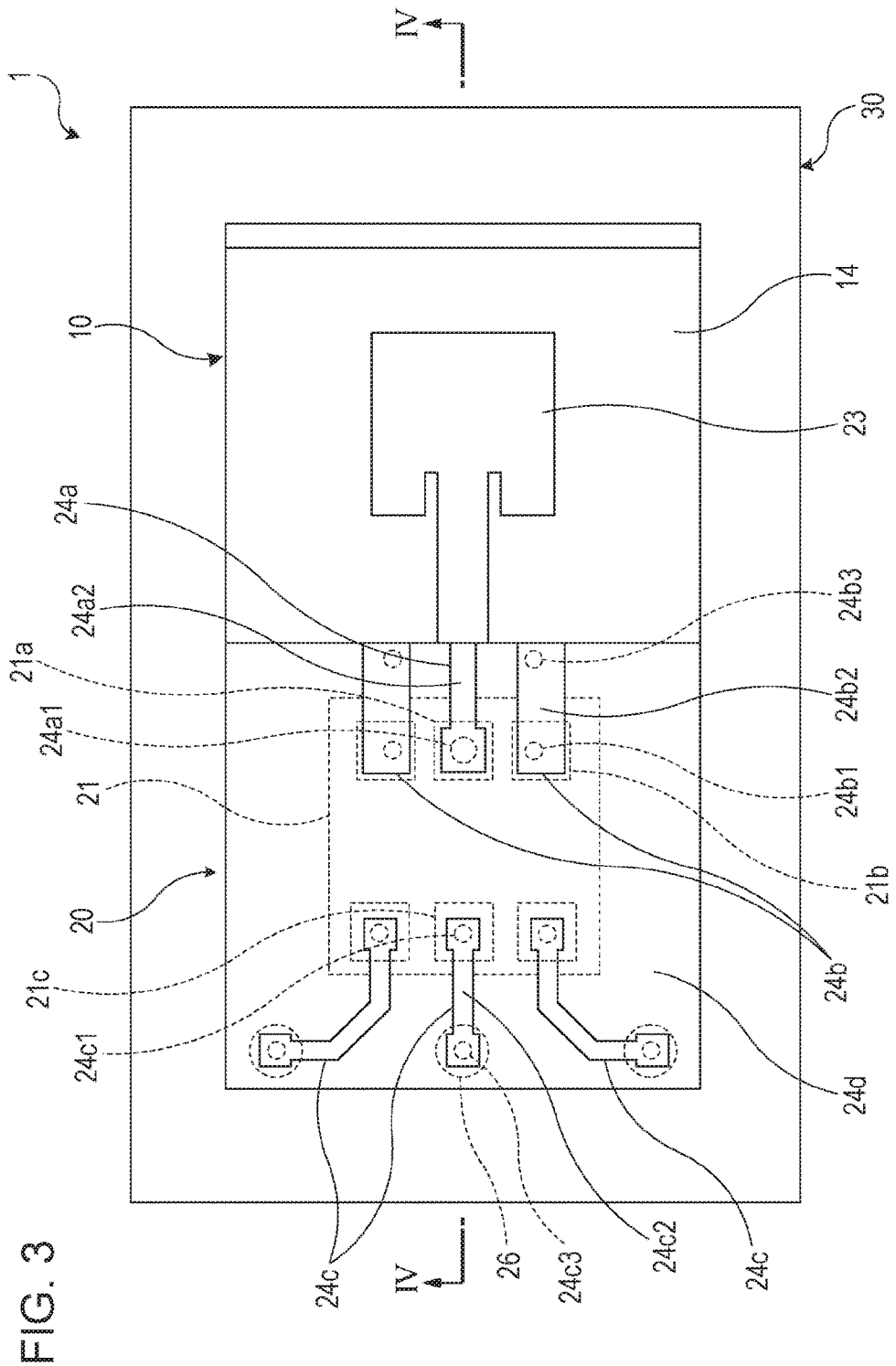
FIG. 3 is a view illustrating an example of an electronic device according to a first embodiment (1)
Figure 4:
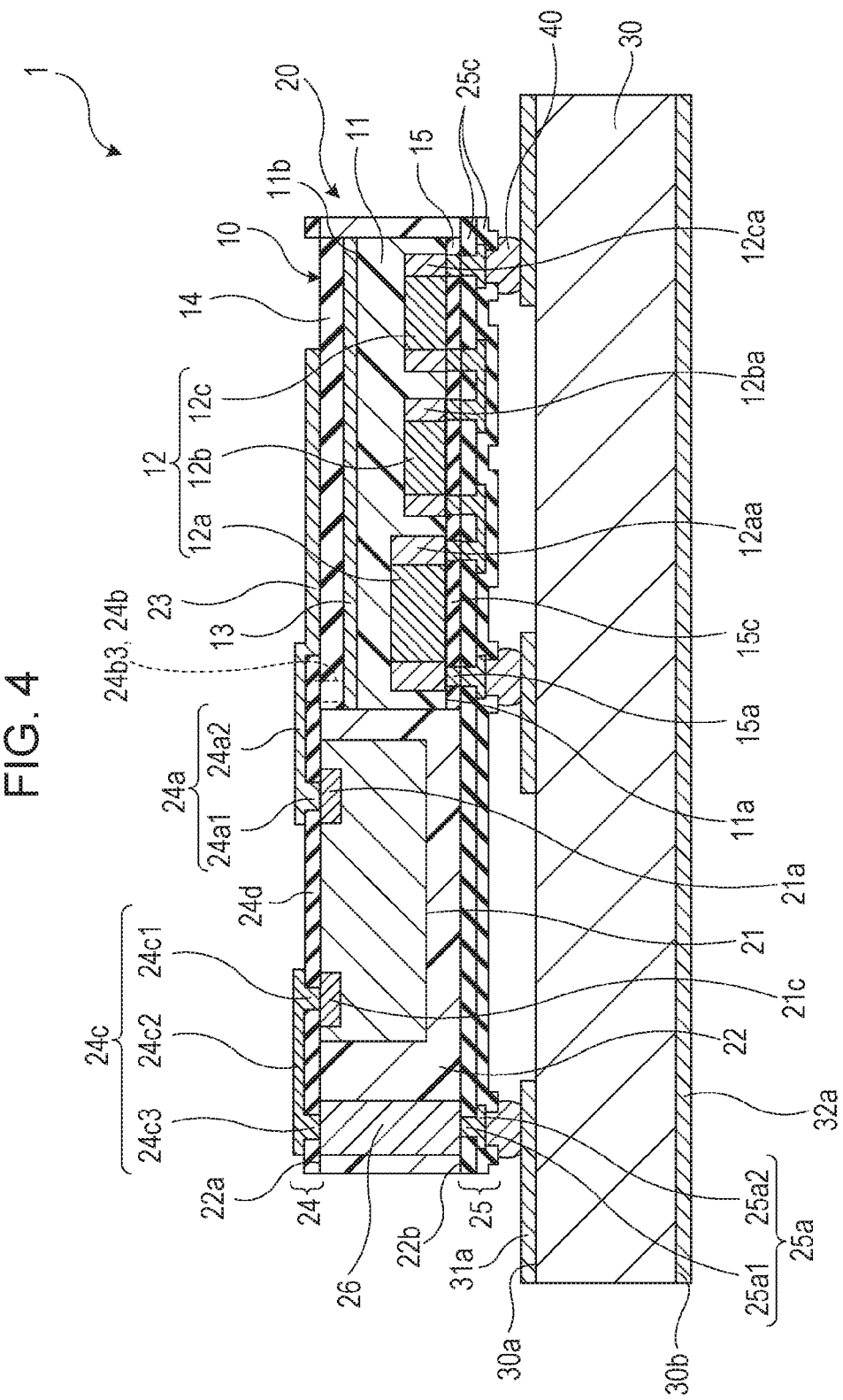
FIG. 4 is a view illustrating the example of the electronic device according to the first embodiment (2)

FIG. 3 and FIG. 4 are diagrams illustrating an example of an electronic device according to the first embodiment. In FIG. 3, main components of the example of the electronic device according to the first embodiment are schematically illustrated in plan view. In FIG. 4, main components of the example of the electronic device according to the first embodiment are schematically illustrated in cross section (taken along line IV-IV in FIG. 3).

An electronic device 1 illustrated in FIG. 3 and FIG. 4 includes a module 20 (electronic device) and a circuit board 30 on which the module 20 is mounted. As illustrated in FIG. 3 and FIG. 4, the module 20 includes a structure 10 and a semiconductor chip 21 (semiconductor device), which are buried in a resin layer 22 so as to be integrated, and further includes a radiating element 23 on the structure 10.

As illustrated in FIG. 4, the structure 10 of the module 20 includes a resin layer 11, a chip part 12 (electronic component), a reflector element 13 to antenna, an insulating layer 14, and a wiring layer 15.

The resin layer 11 is formed of a resin material such as an epoxy resin, which is a molding resin. The resin layer 11 may include an insulating or conductive filler. At least one chip component 12 is buried and mounted in the resin layer 11.

Examples of the chip part 12 include a resistor, a capacitor, and a coil. In FIG. 4, the chip part 12 includes three chip parts 12a, 12b, and 12c, for example. However, the number of the chip parts 12 buried in the resin layer 11 is not limited to three. As illustrated in FIG. 4, the chip parts 12a, 12b, and 12c are buried in and covered with the resin layer 11 such that terminals 12aa, 12ba, and 12ca of the respective chip parts 12a, 12b, and 12c are exposed on a surface 11a of the resin layer 11.

As illustrated in FIG. 4, the wiring layer 15 is disposed on the surface 11a of the resin layer 11. The wiring layer 15 includes an insulating layer 15c and vias 15a extending through the insulating layer 15c and connected to the terminals 12aa, 12ba, and 12ca of the respective chip parts 12a, 12b, and 12c.

As illustrated in FIG. 4, the reflector element 13 is disposed on a surface 11b of the resin layer 11 opposite the surface 11a on which the terminals 12aa, 12ba, and 12ca of the chip parts 12a, 12b, and 12c are exposed. The reflector element 13 is disposed on the surface 11b so as to cover the entire surface 11b of the resin layer 11, for example. The reflector element 13 is a conductor formed of a metal material such as copper (Cu), for example.

As illustrated in FIG. 4, the insulating layer 14 is disposed on the reflector element 13. The insulating layer 14 is disposed on the reflector element 13 so as to cover the entire surface of the reflector element 13, for example. The insulating layer 14 allows the radiating element 23 of the antenna and the reflector element 13 to be away from each other by a uniform distance corresponding to the thickness of the insulating layer 14.

The insulating layer 14 is formed of a resin material, for example. The resin material is selected depending on the type of the signal transmitted or received through the radiating element 23. When a high-frequency signal of a millimeter-wave or terahertz wave is transmitted or received through the radiating element 23, the insulating layer 14 is formed of a resin material that exhibits excellent properties (low-dielectric property, high moisture resistance, or high heat resistance, for example) during high-frequency communication. Examples of the resin material that exhibits excellent properties during the high-frequency communication include a polyphenylene ether material.

As described above, in the structure 10, the reflector element 13 is disposed above the chip parts 12a, 12b, and 12c with (a portion of) the resin layer 11 being disposed there between, and the insulating layer 14 is disposed on the reflector element 13.

The structure 10 having the above-described configuration is buried in the resin layer 22 together with the semiconductor chip 21. The structure 10 buried in the resin layer 22 may include a plurality of structures 10 having an identical configuration or may include a plurality of structures 10 having different configurations (structures having identical built-in chip parts or different built-in chip parts, for example), although only one structure 10 is described as an example herein. In addition, the semiconductor chip 21 buried in the resin layer 22 may include a plurality of semiconductor chips 21 having an identical configuration or a plurality of semiconductor chips 21 having different configurations, although only one semiconductor chip 21 is described as an example herein.

As illustrated in FIG. 4, the insulating layer 14 of the structure 10 and the terminals 21a, 21b, and 21c of the semiconductor chip 21 are exposed on the surface 22a of the resin layer 22. As illustrated in FIG. 3 and FIG. 4, the radiating element 23 is disposed on the insulating layer 14 exposed on the surface 22a of the resin layer 22. The radiating element 23 having a predetermined shape in plan view as illustrated in FIG. 3 is disposed on the insulating layer 14. The radiating element 23 is a patch antenna for example. The shape of the radiating element 23 in plan view is determined depending on the type of the signal transmitted or received through the radiating element 23, for example.

As illustrated in FIG. 3 and FIG. 4, the module 20 includes a wiring layer 24, the wiring layer 25, and at least one through via 26 extending through the resin layer 22. The wiring layer 24 is disposed on the surface 22a, and the wiring layer 25 is disposed on the surface 22b opposite the surface 22a. In FIG. 3, the wiring layer 24 and three through vias 26 are illustrated.

The wiring layer 24 includes a conductive pattern 24a electrically connecting the radiating element 23 and the terminal 21a of the semiconductor chip 21. The radiating element 23 is disposed on the insulating layer 14 exposed on the surface 22a of the resin layer 22 and the terminal 21a is exposed on the surface 22a of the resin layer 22.

The conductive pattern 24a includes a via 24a1 and a wiring 24a2. The via 24a1 extends through the insulating layer 24d disposed on the surface 22a of the resin layer 22 to be connected to the terminal 21a of the semiconductor chip 21. The wiring 24a2 is disposed on the insulating layer 24d to be connected to the via 24a1. The terminal 21a of the semiconductor chip 21, which is connected to the via 24a1 of the conductive pattern 24a, is electrically connected to a transmitting circuit, a receiving circuit, or a transmitting-receiving circuit, which is included in the semiconductor chip 21. The wiring 24a2 connected to the via 24a1 is formed so as to be continuous with the radiating element 23 on the insulating layer 14, for example. The transmitting circuit, the receiving circuit, or the transmitting and receiving circuit of the semiconductor chip 21 is electrically connected to the radiating element 23 through the terminal 21a, the via 24a1 and the wiring 24a2 of the conductive pattern 24a.

The wiring layer 24 further includes conductive patterns 24b electrically connected to the terminals 21b of the semiconductor chip 21 exposed on the surface 22a of the resin layer 22 as illustrated in FIG. 3. The conductive pattern 24b includes a via 24b1, a wiring 24b2, and a via 24b3. The via 24b1 extends through the insulating layer 24d on the resin layer 22 to be connected to the terminal 21b of the semiconductor chip 21. The wiring 24b2 is disposed on the insulating layer 24d to be connected to the via 24b1. The via 24b3 extends through the insulating layer 14 to be connected to the reflector element 13. The terminal 21b of the semiconductor chip 21, which is connected to the via 24b1 of the conductive pattern 24b, is electrically connected to a portion of a conductive pattern in the semiconductor chip 21, the conductive pattern being at the ground (GND) potential. The reflector element 13 is electrically connected to the terminal 21b, which is at the GND potential, through the via 24b1, the wiring 24b2, and the via 24b3 of the conductive pattern 24b.

As illustrated in FIG. 3, for example, the wirings 24b2 of the two conductive patterns 24b, which are at the GND potential, are positioned on the insulating layer 24d such that the wiring 24a2 of the conductive pattern 24a, which is electrically connected to the radiating element 23, is positioned between the wirings 24b2 in plan view.

The wiring layer 24 further includes conductive patterns 24c each electrically connecting a first end of the through via 26 and the terminal 21c, where the through via 26 extends through the resin layer 22 to be exposed on the surface 22a and the terminal 21c of the semiconductor chip 21 is exposed on the surface 22a of the resin layer 22.

The conductive patterns 24c each include a via 24c1, a wiring 24c2, and a via 24c3. The via 24c1 extends through the insulating layer 24d on the resin layer 22 to be connected to the terminal 21c of the semiconductor chip 21. The wiring 24c2 is disposed on the insulating layer 24d to be connected to the via 24c1. The via 24c3 extends through the insulating layer 24d to be connected to the through via 26. The terminal 21c of the semiconductor chip 21, which is connected to the via 24c1 of the conductive pattern 24c, is electrically connected to a signal line or a conductive pattern, which is at a GND potential or power supply potential, in the semiconductor chip 21. The through via 26 is electrically connected to the terminal 21c through the via 24c1, the wiring 24c2, and the via 24c3 of the conductive pattern 24c.

The wiring layer 25, which is positioned on the side opposite to the wiring layer 24, includes conductive patterns 25a electrically connecting a second end of the through via 26, which is exposed on the surface 22b of the resin layer 22, the terminals 12aa, 12ba, and 12ca of the respective chip parts 12a, 12b, and 12c. In this example, the conductive pattern 25a connected to the through via 26 and the via 15a of the wiring layer 15 of the structure 10 is formed on the wiring layer 25. The conductive pattern 25a includes a via 25a1 and a wiring 25a2 connected to the via 25a1. An insulating layer 25c covers predetermined portions of the conductive pattern 25a and the wiring 25a2 of the via 25a1.

The module 20 including the above-described configuration is mounted on the circuit board 30 as illustrated in FIG. 3 and FIG. 4. The circuit board 30 is a printed wiring board, for example. Alternatively, the circuit board 30 may be a relay board such as a silicon interposer or the like. As illustrated in FIG. 4, the circuit board 30 includes a conductive pattern 31a on the surface 30a. The conductive pattern 31a is electrically connected to a conductive pattern such as a wiring or a through hole included in the circuit board 30. The circuit board 30 may also include a conductive pattern 32a on the surface 30b opposite the surface 30a.

The conductive pattern 31a formed on the surface 30a of the circuit board 30 and the conductive pattern 25a of the wiring layer 25 of the module 20 are connected to each other with solder 40 as illustrated in FIG. 4 to be electrically connected to each other.

Here, one module 20 mounted on the circuit board 30 is described as an example, but a plurality of modules 20 including an identical configuration or including different configurations may be disposed on the circuit board 30. As illustrated in FIG. 3 and FIG. 4, in the electronic device 1 according to the first embodiment, the chip parts 12a, 12b, and 12c are disposed in the resin layer 11 of the structure 10 of the module 20. This configuration may reduce an increase in the area of the circuit board 30 compared to a case in which the chip part such as a capacitor is mounted on the circuit board in addition to the module including the antenna (FIG. 2B). In other words, in the electronic device 1, there is not required a mounting area on the circuit board 30 for mounting the chip parts 12a, 12b, and 12c at a position away from the module 20, and thus the increase in the area of the circuit board 30 is reduced at least by the mounting area for the chip parts 12a, 12b, and 12c.

In the electronic device 1 of the first embodiment, the chip parts 12a, 12b, and 12c, which are disposed in the resin layer 11, are positioned on an opposite side of the reflector element 13, which is disposed on the resin layer 11, with respect to the radiating element 23. That is, in the electronic device 1, the reflector element 13 (and the insulating layer 14) is disposed between the chip parts 12a, 12b, and 12c and the radiating element 23.

An advantage obtained by the arrangement in which the reflector element 13 is disposed between the chip parts 12a, 12b, and 12c and the radiating element 23 is described. FIG.

5 is a view for explaining the advantage obtained by the electronic device according to the first embodiment.

Figure 5:
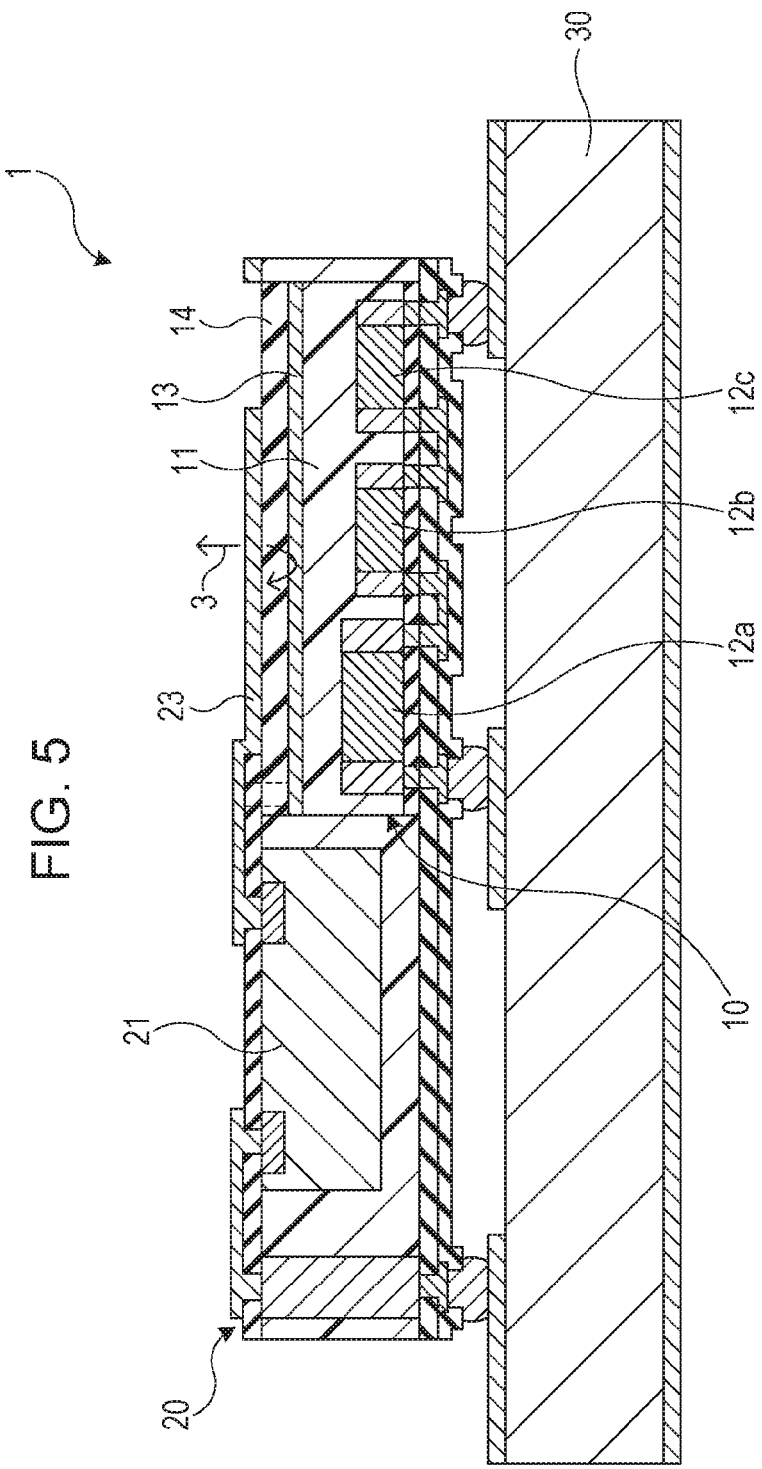
FIG. 5 is a view for explaining advantages device according to the first embodiment.

In the electronic device 1 having the above-described configuration, as illustrated in FIG. 5, radiation 3 from the radiating element 23 during transmission or reception of a signal is shielded by the reflector element 13. The reflector element 13 reduces the influence of the radiation 3 on the chip parts 12a, 12b, and 12c, or reduces the radiation 3 entering the chip parts 12a, 12b, and 12c.

In the electronic device 1 according to the first embodiment, the generation of noise in the circuit including the semiconductor chip 21, the chip parts 12a, 12b, and 12c, and the circuit board 30 is sufficiently reduced by the above-described arrangement.

Hereinafter, there is described an example of a method of producing the above-described electronic device 1. FIG. 6 to FIG. 26 are diagrams for explaining the example of the method of producing the electronic device according to the first embodiment. In FIG. 6 to FIG. 26, cross sections of important portions at each production step are schematically illustrated. The cross-sectional views of the important portions at the steps, which are illustrated in FIG. 6 to FIG. 26, are each taken along a line corresponding to the line IV-IV in FIG. 3.

Figure 6:
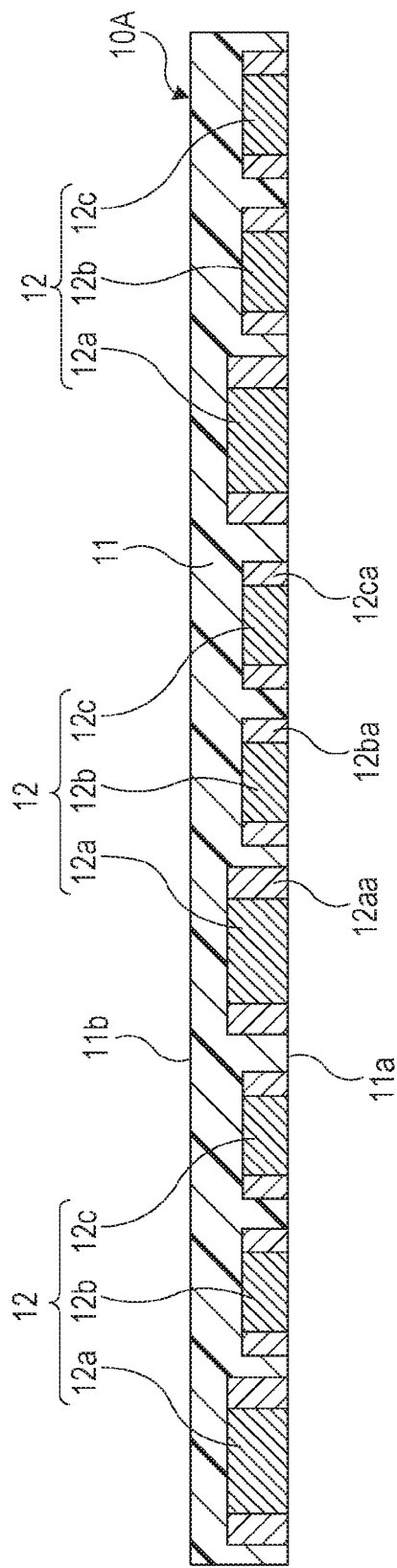
FIG. 6 is a view for explaining an example of a method of producing the electronic device according to the first embodiment (1)

A method of producing the structure 10 is described with reference to FIG. 6 to FIG. 10 at first. Wafer Level Packaging (WLP) technology is used for producing the structure 10. As illustrated in FIG. 6, a plurality of sets of three chip parts 12a, 12b, and 12c are placed at predetermined positions of a support and sealed with the resin layer 11 so as to form a pseudo wafer 10A. Then, the pseudo wafer 10A and the support are separated from each other. The terminals 12aa, 12ba, and 12ca of the respective chip parts 12a, 12b, and 12c are exposed on a surface (surface 11a of the resin layer 11) of the pseudo wafer 10A, the surface being a surface separated from the support.

Figure 7:
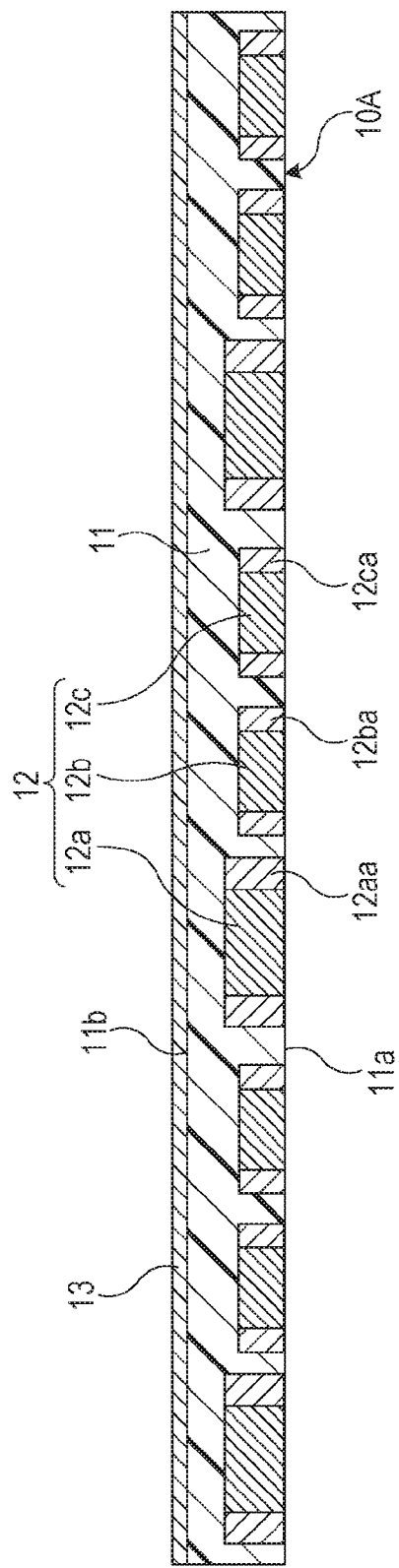
FIG. 7 is a view for explaining the example of the method of producing the electronic device according to the first embodiment (2)

Then, as illustrated in FIG. 7, the reflector element 13 is formed on a surface, that is, on the surface 11b of the resin layer 11 opposite the surface of the pseudo wafer 10A on which the terminals 12aa, 12ba, and 12ca of the respective chip parts 12a, 12b, and 12c are exposed. A metal film such as a copper film is laminated on the surface 11b of the pseudo wafer 10A so as to form the reflector element 13, for example.

Figure 8:
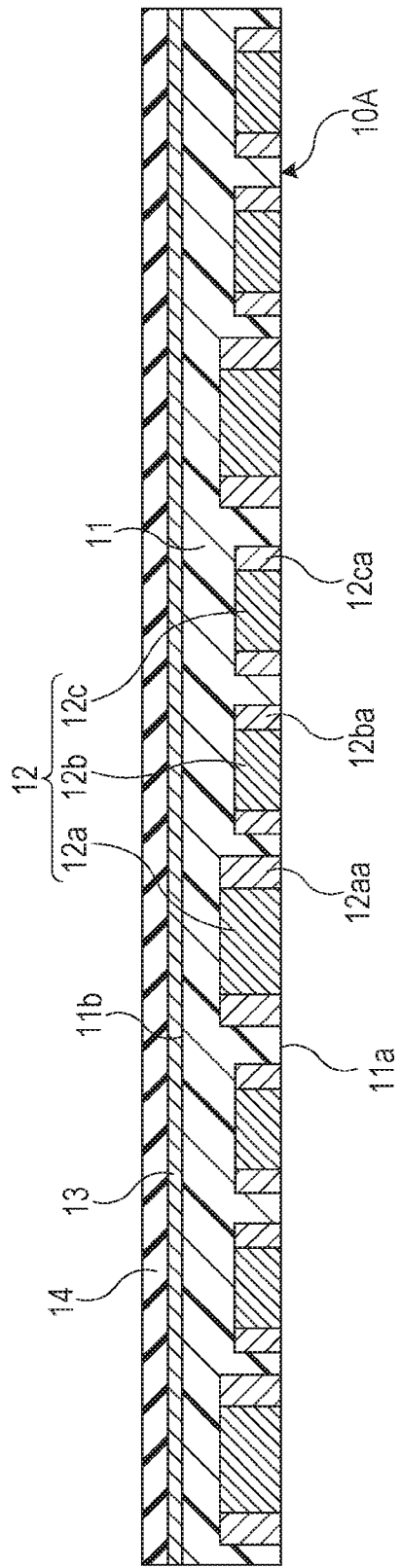
FIG. 8 is a view for explaining the example of the method of producing the electronic device according to the first embodiment (3)

Then, as illustrated in FIG. 8, the insulating layer 14 is formed on the reflector element 13. The insulating layer 14 is an insulating layer disposed between the reflector element 13 and the radiating element 23, which is described later. The thickness of the formed insulating layer 14 is one that allows the reflector element 13 and the radiating element 23 to be away from each other by a uniform distance. A polyphenylene ether-based material, for, is example, is used for forming the insulating layer 14.

Figure 9:
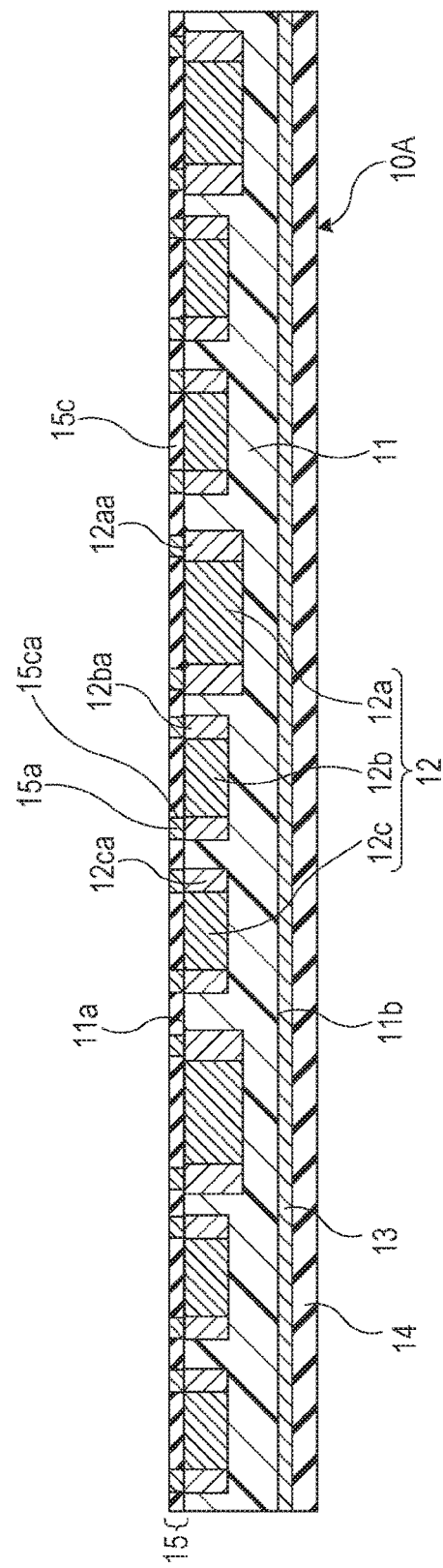
FIG. 9 is a view for explaining the example of the method of producing the electronic device according to the first embodiment (4)

Then, as illustrated in FIG. 9, the wiring layer 15 is formed on the surface 11a of the resin layer 11 of the pseudo wafer 10A. The wiring layer 15 includes the insulating layer 15c and the vias 15a extending through the insulating layer 15c. The vias 15a are connected to the terminals 12aa, 12ba, and 12ca of the respective chip parts 12a, 12b, and 12c.

In the formation of the wiring layer 15, a photosensitive insulating material such as a photosensitive phenolic material for a material of the insulating layer 15c is applied on the surface 11a of the resin layer 11. Subsequently, the photosensitive insulating material is exposed to light and developed to form openings 15ca facing the terminals 12aa, 12ba, and 12ca. Then, a seed layer is formed on the insulating layer 15c having the openings 15ca, and a resist pattern having openings corresponding to the openings 15ca in the insulating layer 15c is formed on the seed layer, and electrolytic plating in which the seed layer is used as a power supply layer is performed. After the electrolytic plating, the resist pattern is removed, and then portions of the seed layer, which become exposed by the removing of the resist pattern, are removed. As a result, the vias 15a are formed in the openings 15ca in the insulating layer 15c.

Figure 10:
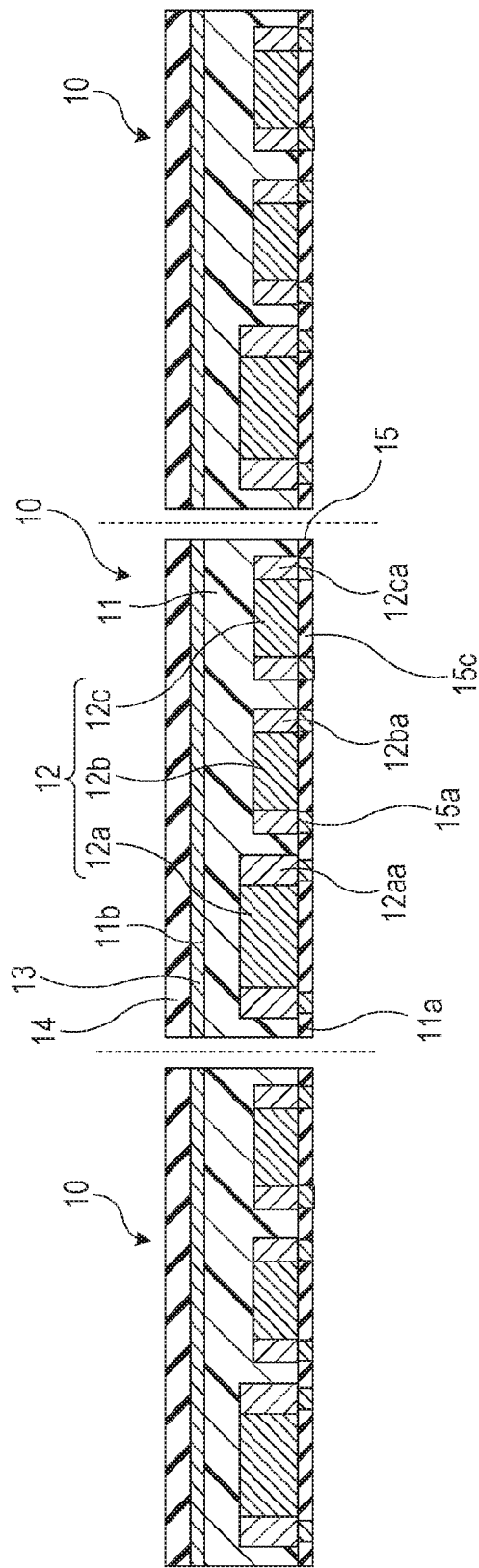
FIG. 10 is a view for explaining the example of a method of producing the electronic device according to the first embodiment (5)

The vias 15a are formed by the electrolytic plating in the above-described example. However, copper or gold (Au) stud bumps may be formed as the vias 15a. As illustrated in FIG. 10, the pseudo wafer 10A after the formation of the wiring layer 15 is diced at predetermined positions, as indicated by broken lines in FIG. 10, with a diamond blade, for example. By doing so, one pseudo wafer 10A is diced into a plurality of pieces each in the form of the structure 10 (laminated body) as illustrated in FIG. 10.

Next, a method for producing the module 20 including the above-described structure 10 is described with reference to FIG. 11 to FIG. 26. The module 20 is produced by using WLP such as Fan-Out Wafer Level Packaging (FO-WLP).

Figure 11:
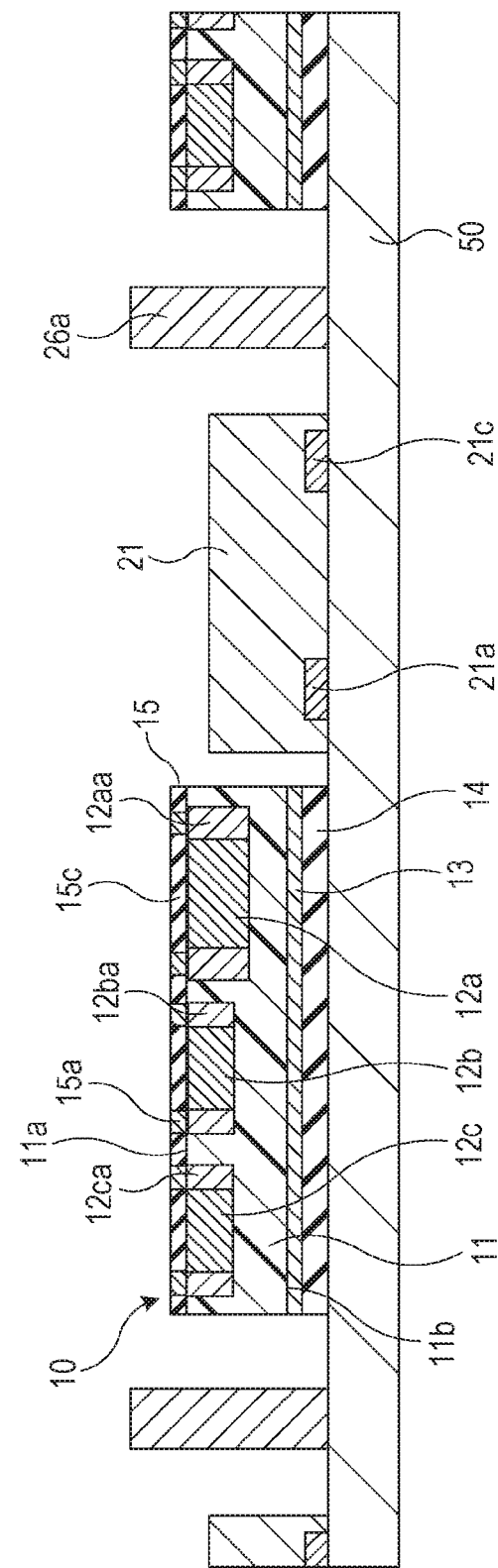
FIG. 11 is a view for explaining the example of a method of producing the electronic device according to the first embodiment (6)

As illustrated in FIG. 11, there are prepared the structure 10, the semiconductor chip 21, and a conductive pin 26a, which becomes the through via 26. A plurality of sets including the structure 10, the semiconductor chip 21, and the conductive pin 26a as illustrated in FIG. 11 are placed at predetermined positions of the support 50. The structure 10 is placed such that the insulating layer 14 thereof faces the support 50. The semiconductor chip 21 is placed such that a surface on which the terminals 21a, 21b, and 21c are exposed faces the support 50. In FIG. 11 to FIG. 26, only the terminals 21a and 21c are illustrated. The conductive pin 26a is placed such that a first end surface faces the support 50.

Figure 12:
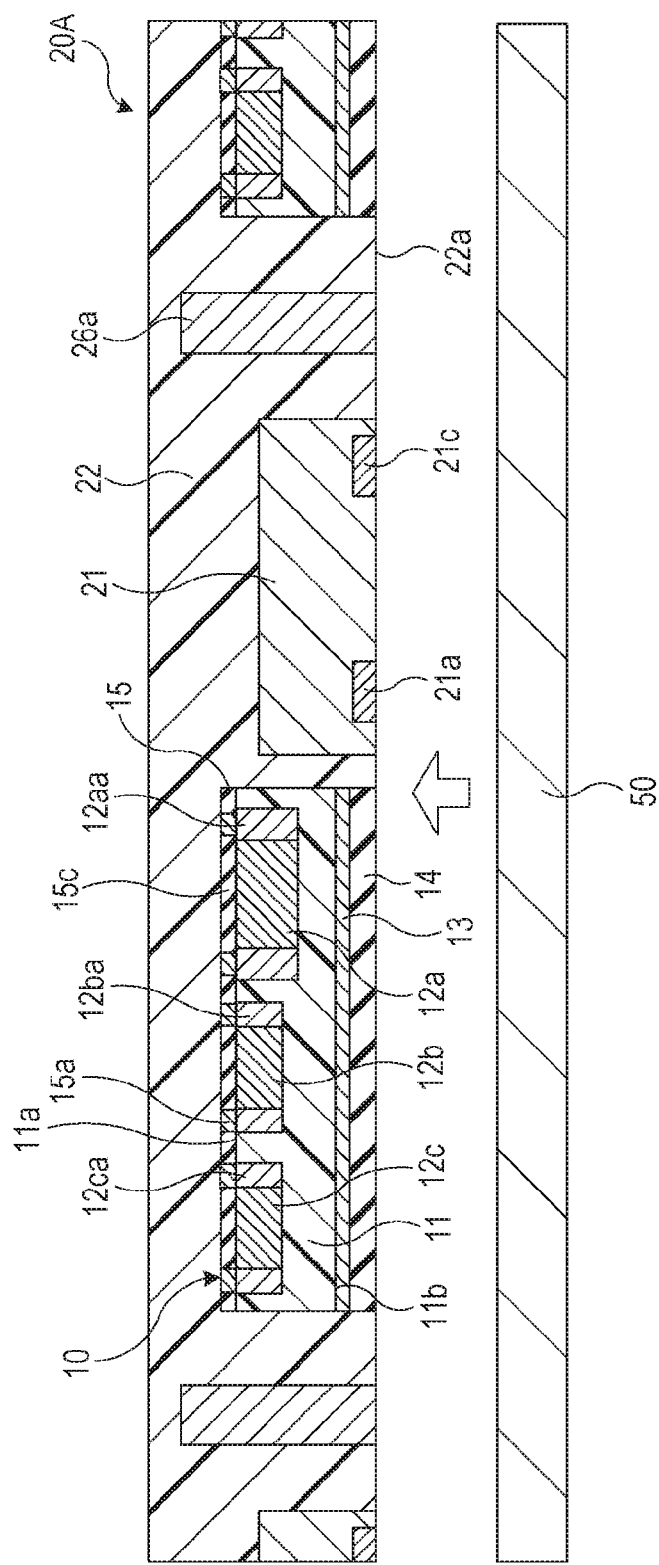
FIG. 12 is a view for explaining the example of a method of producing the electronic device according to the first embodiment (7)

Then, as illustrated in FIG. 12, the sets including the structure 10, the semiconductor chip 21, and the conductive pin 26a, which are disposed on the support 50, are sealed with the resin layer 22 so as to form the pseudo wafer 20A. Then, the pseudo wafer 20A and the support 50 are separated from each other. On the surface 22a of the pseudo wafer 20A removed from the insulating layer 14, the terminals 21a, 21b, and 21c of the semiconductor chip 21, and the first end surface of the conductive pin 26a are exposed on the surface 22a of the resin layer 22 of the pseudo wafer 20A.

Figure 13:
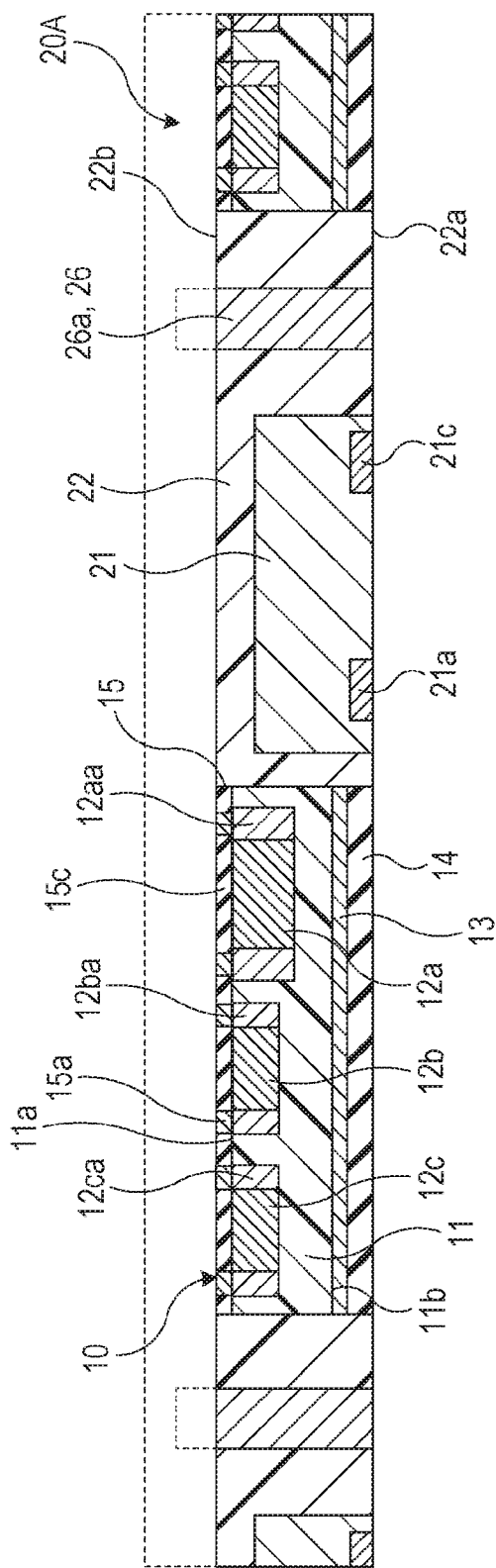
FIG. 13 is a view for explaining the example of the method of producing the electronic device according to the first embodiment (8)

Then, as illustrated in FIG. 13, the resin layer 22 is ground to expose the via 15a of the wiring layer 15 of the structure 10 and the conductive pin 26a, which are included in the pseudo wafer 20A. In this example, a portion of the resin layer 22 and a portion of the conductive layer 26a are ground. The resin layer 22 is ground with a diamond wheel, for example. As a result of the grinding of the resin layer 22, in the pseudo wafer 20A, the vias 15a of the wiring layer 15 of the structure 10 and a second end surface of the conductive pin 26a (the through via 26) are exposed on the surface (the surface 22b of the resin layer 22) opposite the surface 22a of the pseudo wafer 20A separated from the support 50.

Figure 14:
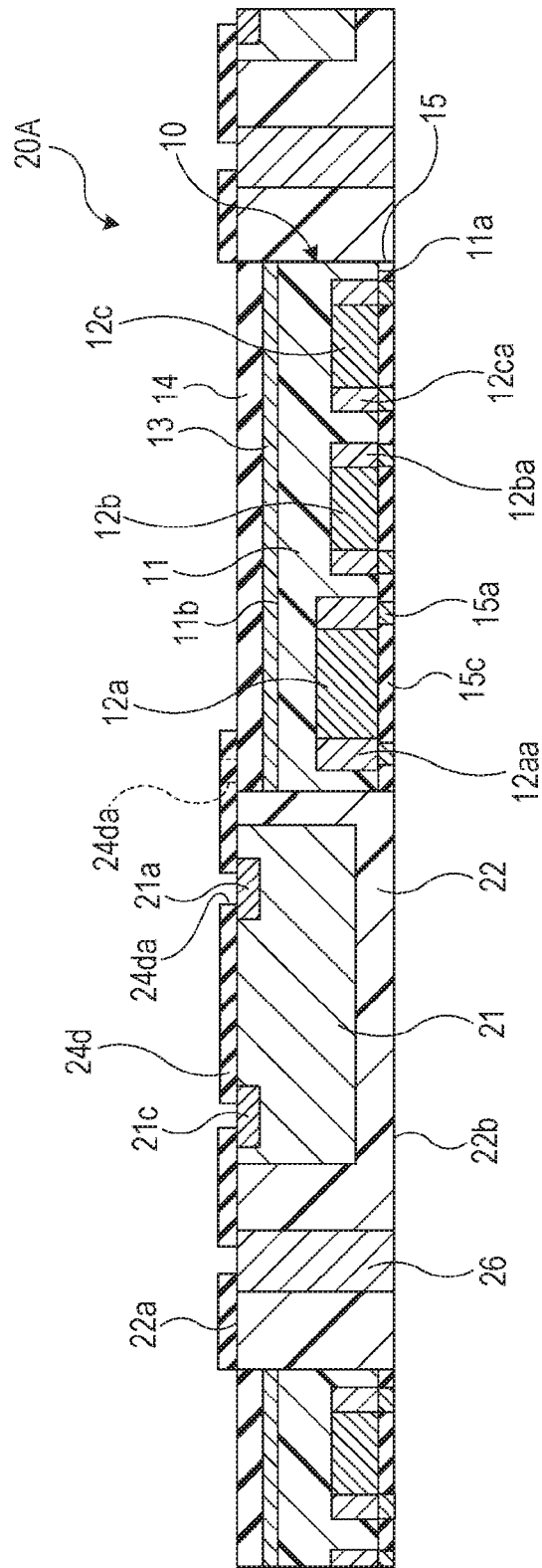
FIG. 14 is a view for explaining the example of the method of producing the electronic device according to the first embodiment (9)

Then, as illustrated in FIG. 14, in the pseudo wafer 20A, the insulating layer 24d is formed on the surface 22a of the resin layer 22 on which the semiconductor chip 21 and the terminals 21a and 21c thereof, for example, and the insulating layer 14 of the structure 10 are exposed. A photosensitive phenolic resin is applied to the surface 22a of the resin layer 22 to a thickness of 10 μm, for example, and exposed to light. Then, the phenolic resin is developed with tetramethylammonium hydroxide (TMAH) and cured at a temperature of 200° C. to 250° C. (200° C., for example). As a result of the process, the insulating layer 24d is formed on the surface 22a of the resin layer 22. Openings 24da facing the terminals 21a to 21c of the semiconductor chip 21, the through via 26, and the insulating layer 14 are formed in the insulating layer 24d.

The openings 24da are formed in the insulating layer 24d at positions corresponding to the vias 24a1, 24b1, and 24c1, which are connected to the respective terminals 21a, 21b, and 21c of the semiconductor chip 21. The vias 24a1 to 24c1 are illustrated in FIG. 3 and FIG. 4 and described later. The openings 24da are also formed at positions corresponding to the vias 24b3 connected to the reflector element 13 and the vias 24c3 connected to the through vias 26. The vias 24b3 and 24c3 are illustrated in FIG. 3 and FIG. 4 and described later. The opening 24da is also formed at a position corresponding to the radiating element 23, which is illustrated in FIG. 3 and FIG. 4 and described later.

Figure 15:
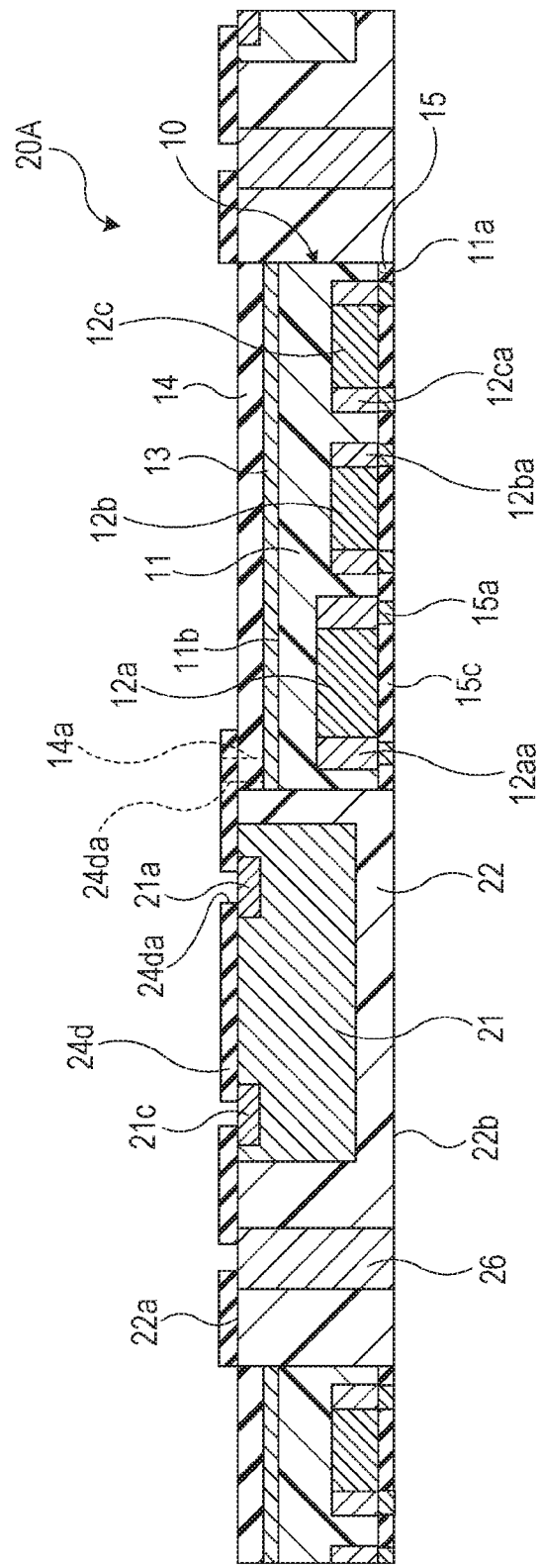
FIG. 15 is a view for explaining the example of the method of producing the electronic device according to the first embodiment (10)

As illustrated in FIG. 15, after the formation of the insulating layer 24d including the predetermined openings 24da, the opening 14a, which extends to the reflector element 13 through the insulating layer 14 of the structure 10 of the pseudo wafer 20A, is formed. A portion of the insulating layer 14, which corresponds to the via 24b3 connected to the reflector element 13, is removed by photolithography or etching, for example, such that the opening 14a extending to the reflector element 13 is formed. In FIG. 15, the opening 14a in the insulating layer 14 is indicated by a dotted line.

Figure 16:
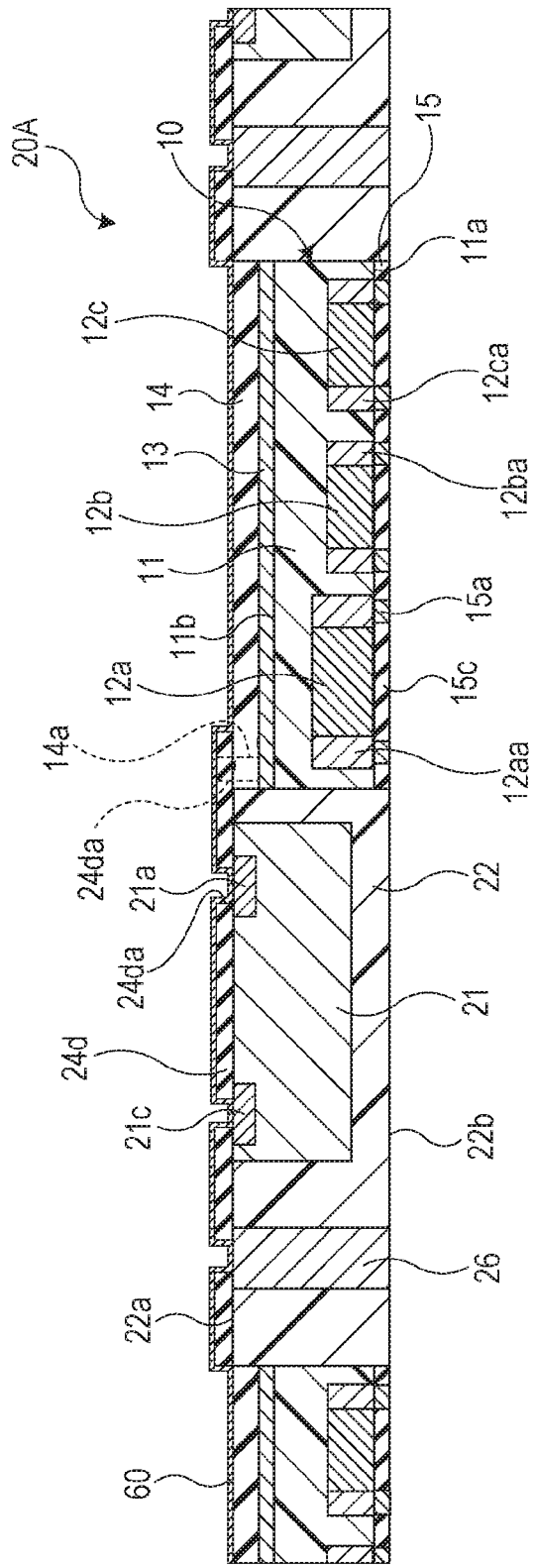
FIG. 16 is a view for explaining the example of the method of producing the electronic device according to the first embodiment (11)

Then, as illustrated in FIG. 16, a seed layer 60 is formed on the insulating layer 24d. The seed layer 60 extends continuously over an upper surface of the insulating layer 24d and inside surfaces of the openings 24da facing the terminals 21a, 21b, and 21c of the semiconductor chip 21, the through via 26, the reflector element 13, and the insulating layer 14. The seed layer 60 is formed by depositing or sputtering, for example, titanium (Ti) on the insulating layer 24d to a thickness of 20 nm, and further depositing or sputtering, for example, copper on the titanium layer to a thickness of 100 nm.

Figure 17:
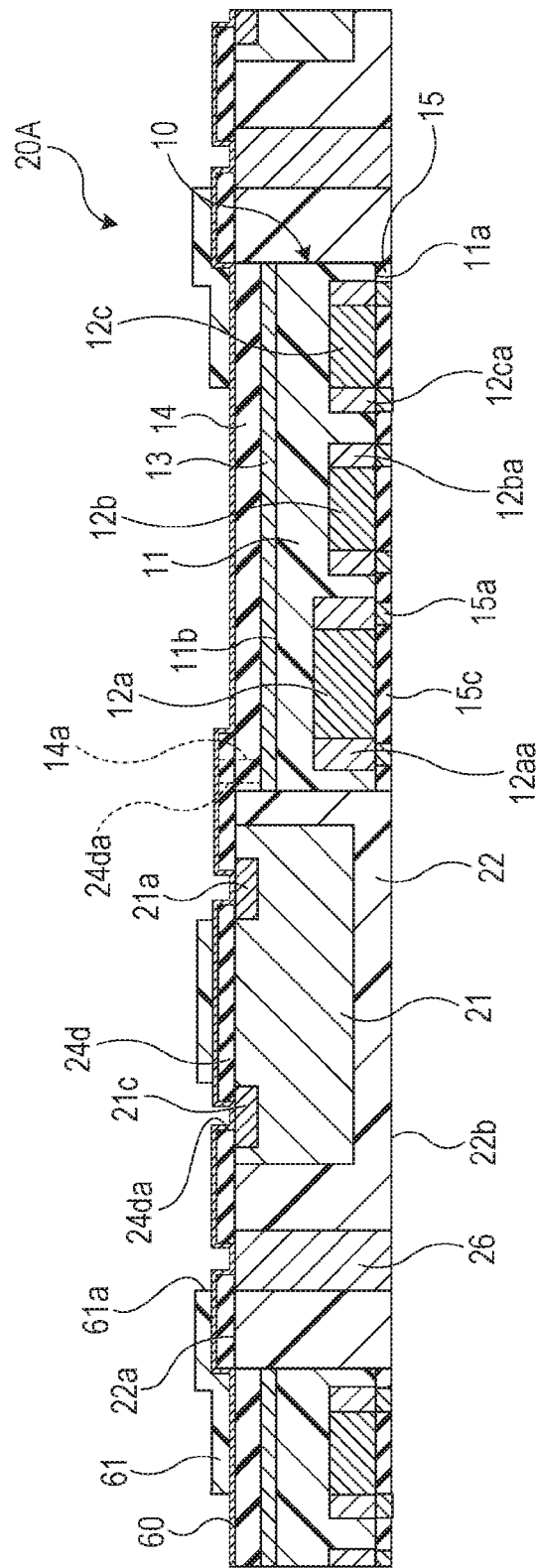
FIG. 17 is a view for explaining the example of the method of producing the electronic device according to the first embodiment (12)

Then, as illustrated in FIG. 17, a resist pattern 61 is formed on the seed layer 60. The resist pattern 61 is formed by applying a resist material on the seed layer 60 to a thickness of 8 µm, exposing the resist material to light, and developing the exposed resist material with TMAH, for example. Openings 61a are formed in the resist pattern 61 at positions corresponding to the conductive patterns 24a, 24b, and 24c and the radiating element 23, which are illustrated in FIG. 3 and FIG. 4 and described later.

Figure 18:
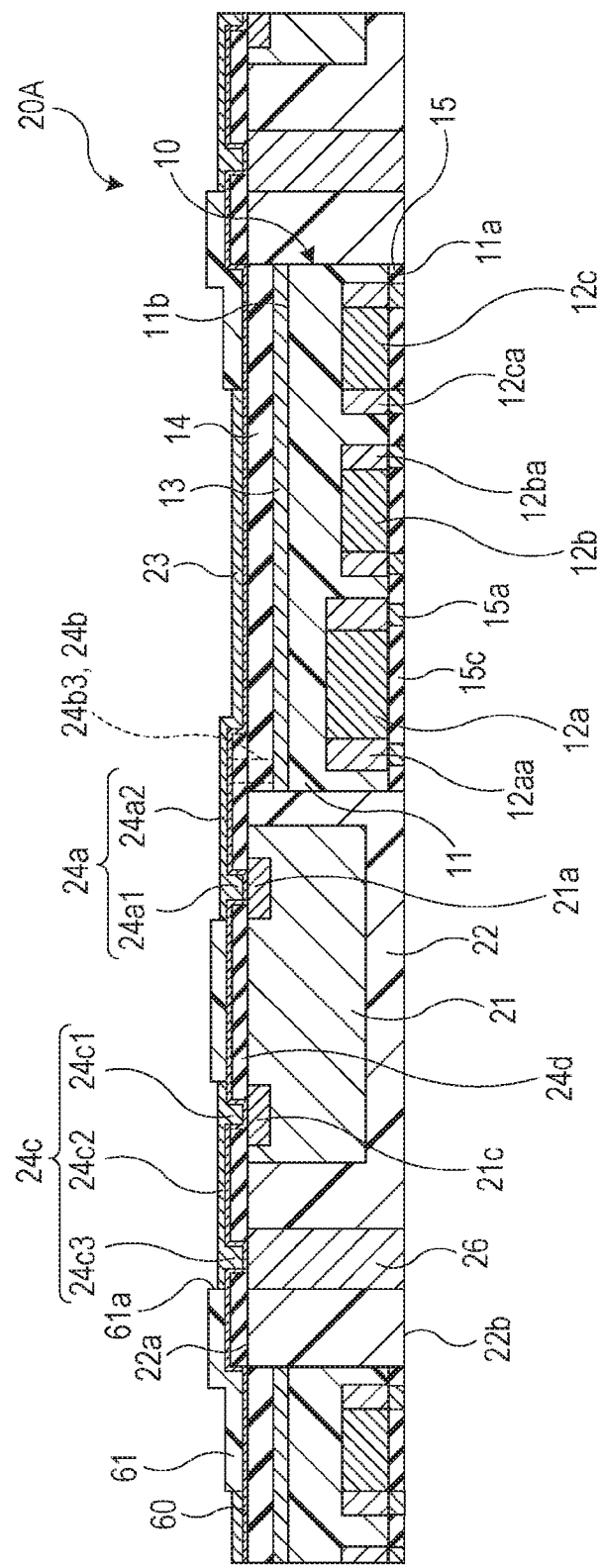
FIG. 18 is a view for explaining the example of the method of producing the electronic device according to the first embodiment (13)

Then, as illustrated in FIG. 18, the conductive patterns 24a, 24b, and 24c and the radiating element 23 are formed by electrolytic copper plating in which the resist pattern 61 is used as a mask and the seed layer 60 is used as a power supply layer, for example.

The conductive pattern 24a formed by the electrolytic plating includes the via 24a1 connected to the terminal 21a of the semiconductor chip 21 and the wiring 24a2 connected to the via 24a1. The radiating element 23 formed by the electrolytic plating is continuous with the wiring 24a2.

In addition, the conductive patterns 24b formed by the electrolytic plating each include the via 24b1 connected to the terminal 21b of the semiconductor chip 21, the via 24b3 connected to the reflector element 13, and the wiring 24b2 connected to the vias 24b1 and 24b3. In FIG. 18, only the via 24b3 of the conductive pattern 24b, which is connected to the reflector element 13, is indicated by a dotted line.

In addition, the conductive pattern 24c formed by electrolytic plating includes the via 24c1 connected to the terminal 21c of the semiconductor chip 21, the via 24c3 connected to the through via 26, and the wiring 24c2 connected to the vias 24c1 and 24c3.

Figure 19:
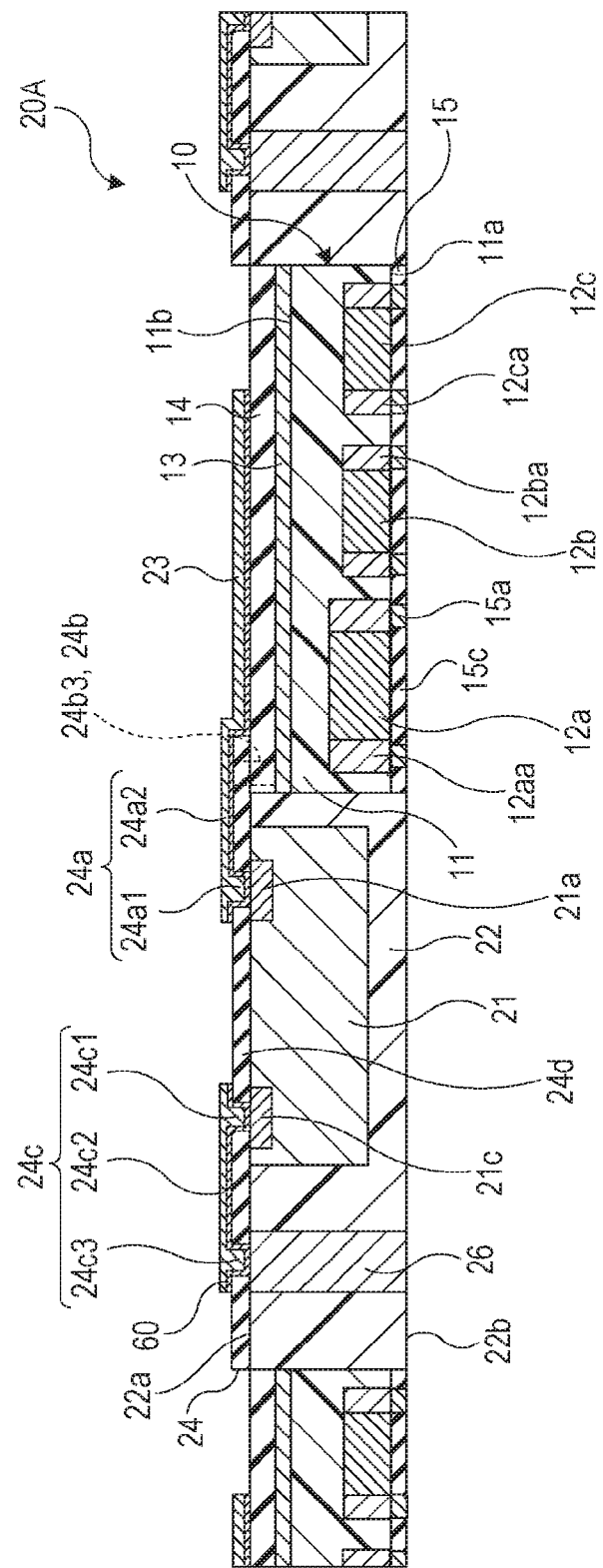
FIG. 19 is a view for explaining the example of the method of producing the electronic device according to the first embodiment (14)

The thickness of each of the wirings 24a2, 24b2, and 24c2, and the radiating element 23 is 5 µm, for example. Then, as illustrated in FIG. 19, the resist pattern 61 is removed, and then portions of the seed layer 60, which become exposed by the removing, are removed. The resist pattern 61 is removed with acetone, for example. When the seed layer 60 has a laminated structure including the titanium layer and the copper layer, the copper layer is removed by wet etching using an etching liquid including potassium sulfate ($K_2SO_4$), and then the titanium layer is removed by dry etching using an etching gas including tetrafluoromethane ($CF_4$) and oxygen ($O_2$), for example. Thus, the conducting patterns 24a to 24c and the radiating element 23, which are electrically connected to the semiconductor chip 21, are obtained.

Figure 20:
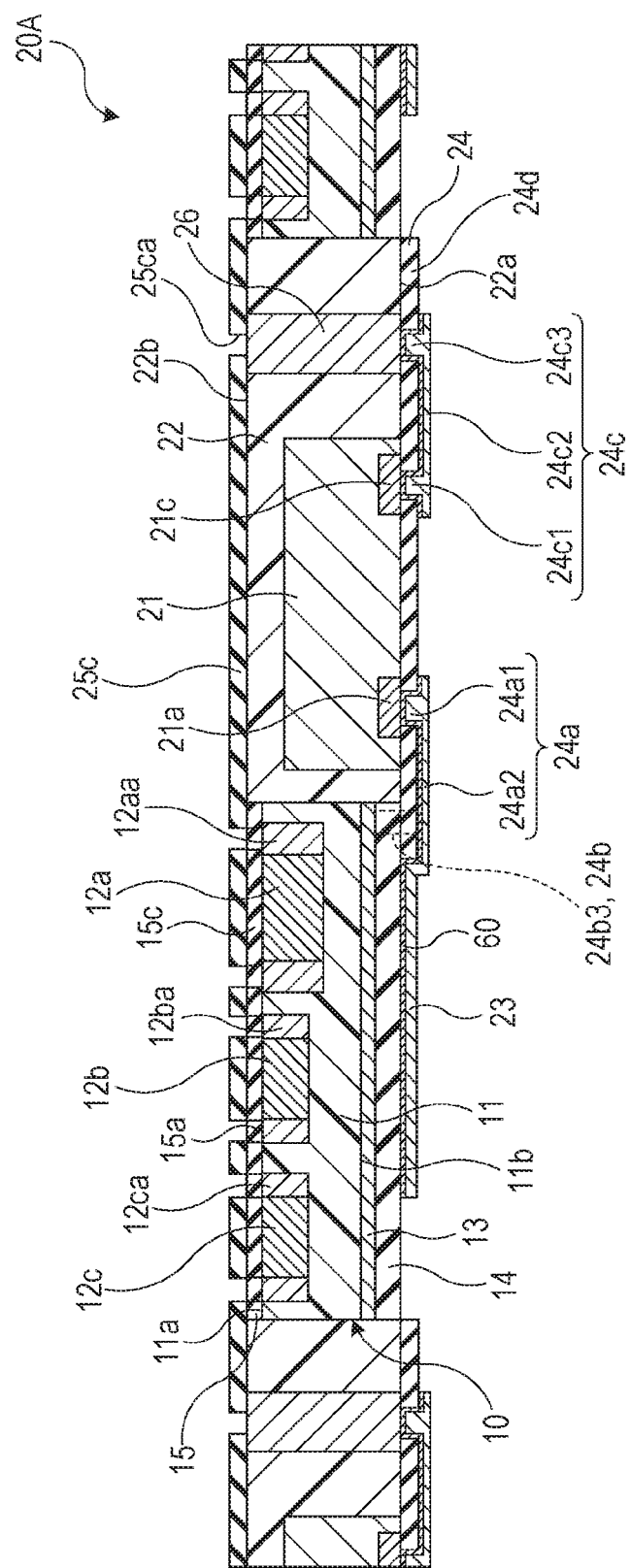
FIG. 20 is a view for explaining the example of the method of producing the electronic device according to the first embodiment (15)

The wiring layer 24, which is illustrated in FIG. 3 and FIG. 4, is formed on the surface 22a of the resin layer 22 of the pseudo wafer 20A by the steps described with reference to FIG. 14 to FIG. 19. Then, as illustrated in FIG. 20, in the pseudo wafer 20A, the insulating layer 25c is formed on the surface 22b of the resin layer 22, on which the wiring layer 15 of the structure 10 is exposed. The insulating layer 25c illustrated in FIG. 20 is a portion of the insulating layer 25c illustrated in FIG. 4. The insulating layer 25c is formed by following process. First, a photosensitive phenolic resin is applied to the surface 22b of the resin layer 22, for example, to a thickness of 10 µm and exposed to light. Then, the photosensitive phenolic resin is developed with TMAH, and cured at a temperature in the range of 200° C. to 250° C., for example, at 200° C. As a result of the process, a portion of the insulating layer 25c is formed on the surface 22b of the resin layer 22. In the insulating layer 25c, the vias 15a connected to the terminals 12aa, 12ba, and 12ca of the respective chip parts 12a, 12b, and 12c, and openings 25ca facing the through vias 26 are formed.

Figure 21:
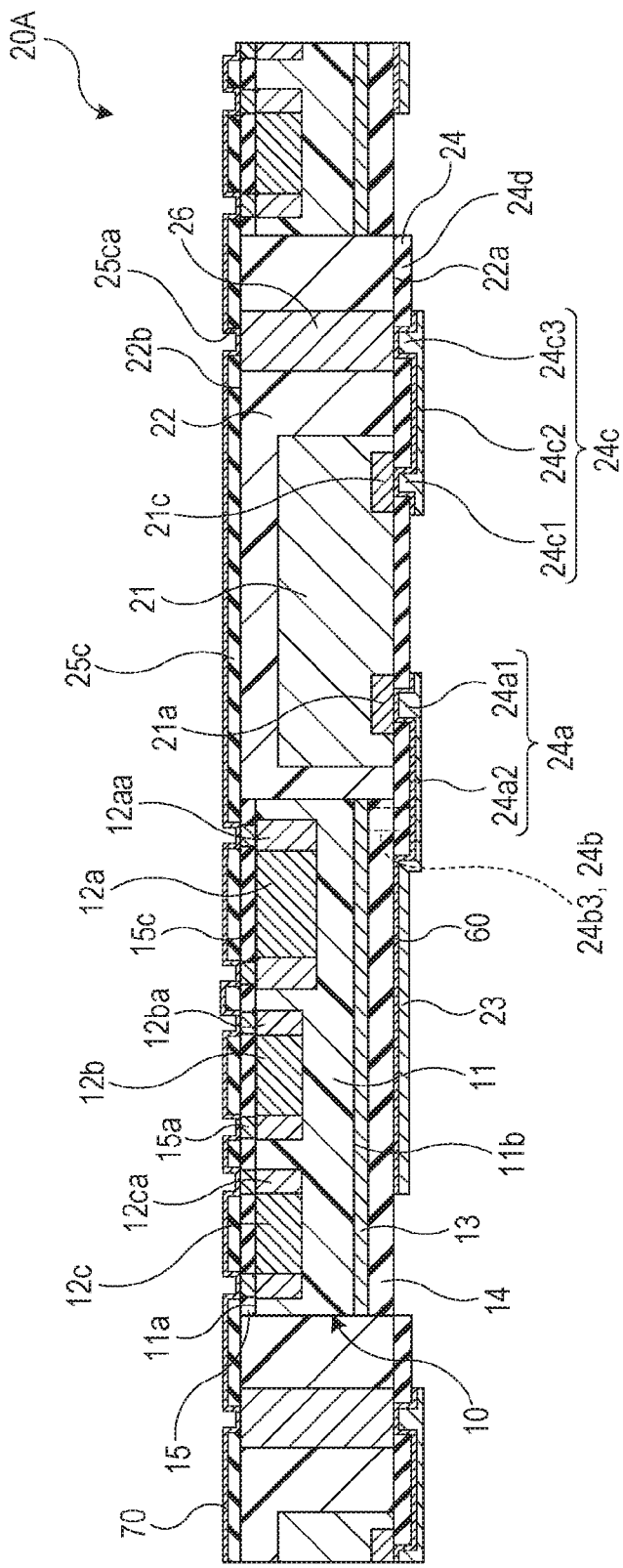
FIG. 21 is a view for explaining the example of the method of producing the electronic device according to the first embodiment (16)

Then, as illustrated in FIG. 21, a seed layer 70 is formed on the insulating layer 25c. The seed layer 70 extends continuously over an upper surface of the insulating layer 25c and the inside surface of each opening 25ca. The seed layer 70 is formed by sputtering, for example, titanium on the insulating layer 25c to a thickness of 20 nm, and copper on the titanium layer to a thickness of 100 nm.

Figure 22:
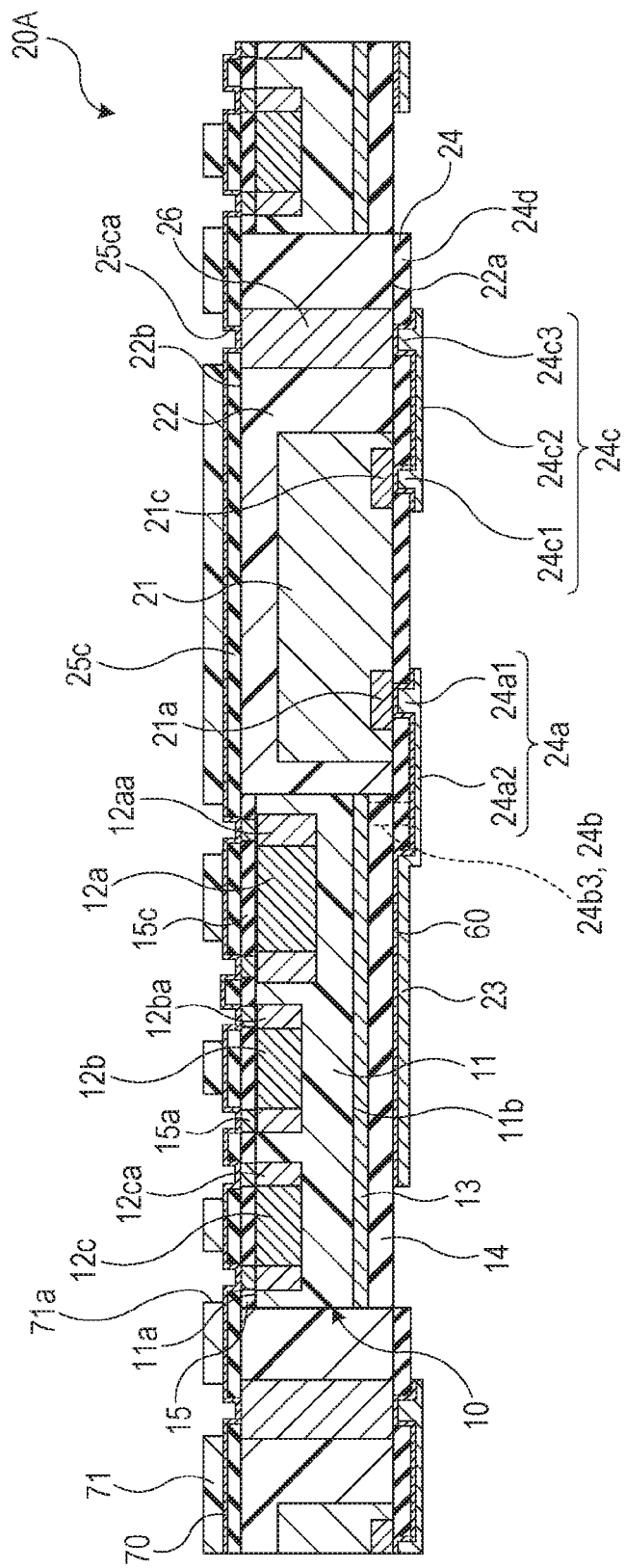
FIG. 22 is a view for explaining the example of the method of producing the electronic device according to the first embodiment (17)

Then, as illustrated in FIG. 22, a resist pattern 71 is formed on the seed layer 70. The resist pattern 71 is formed by applying a resist material to the seed layer 70 to a thickness of 8 µm, exposing the resist material to light, and developing the exposed resist material with TMAH, for example. Openings 71a are formed in the resist pattern 71 at positions corresponding to the conductive patterns 25a each including the via 25a1 and the wiring 25a2 connected to the via 25a1. The conductive pattern 25a is illustrated in FIG. 4 and described later.

Figure 23:
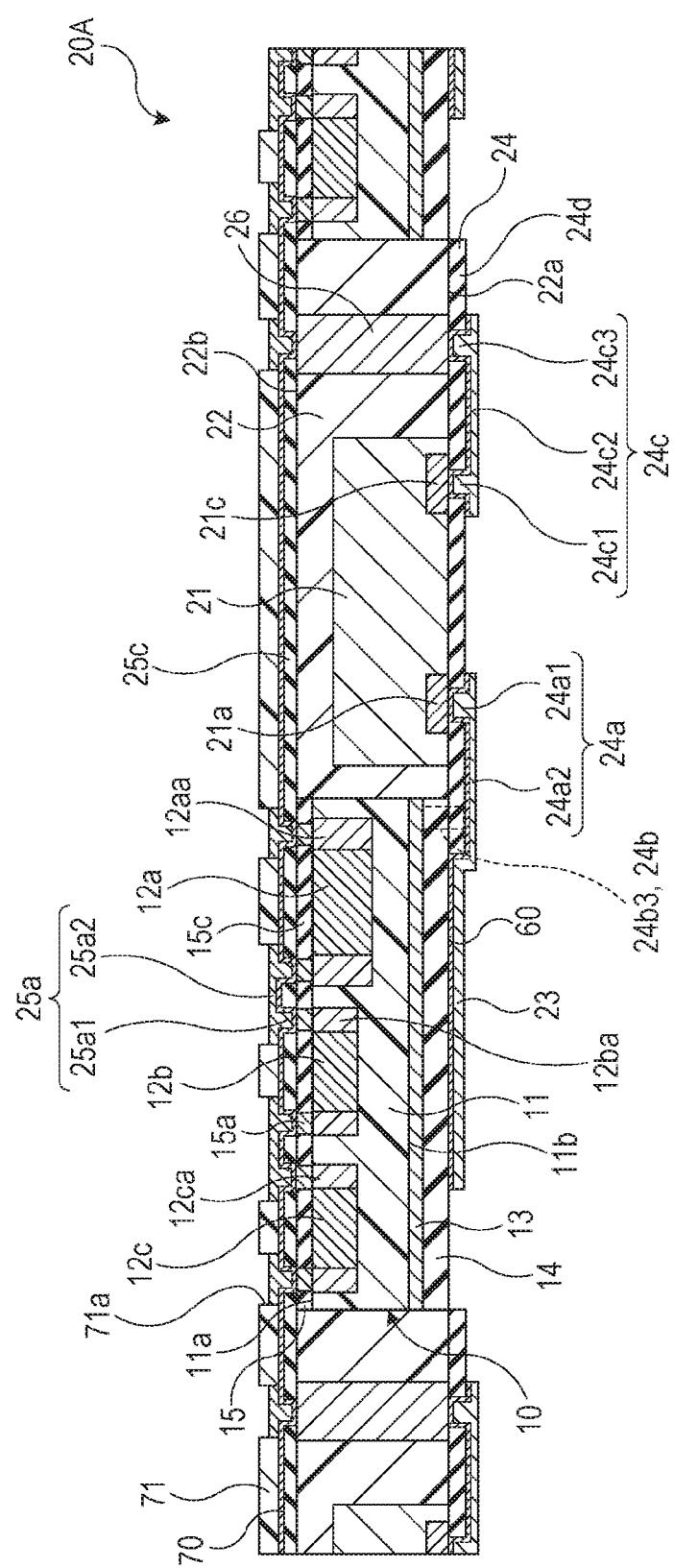
FIG. 23 is a view for explaining the example of the method of producing the electronic device according to the first embodiment (18)

Then, as illustrated in FIG. 23, the conductive pattern 25a is formed by electrolytic copper plating, for example, in which the resist pattern 71 is used as a mask and the seed layer 70 is used as a power supply layer. The conductive pattern 25a formed by the electrolytic copper plating includes the via 15a of the wiring layer 15 of the structure 10, the via 25a1 connected to the through via 26, and the wiring 25a2 connected to the via 25a1. The thickness of the wiring 25a2 is 5 µm, for example.

Figure 24:
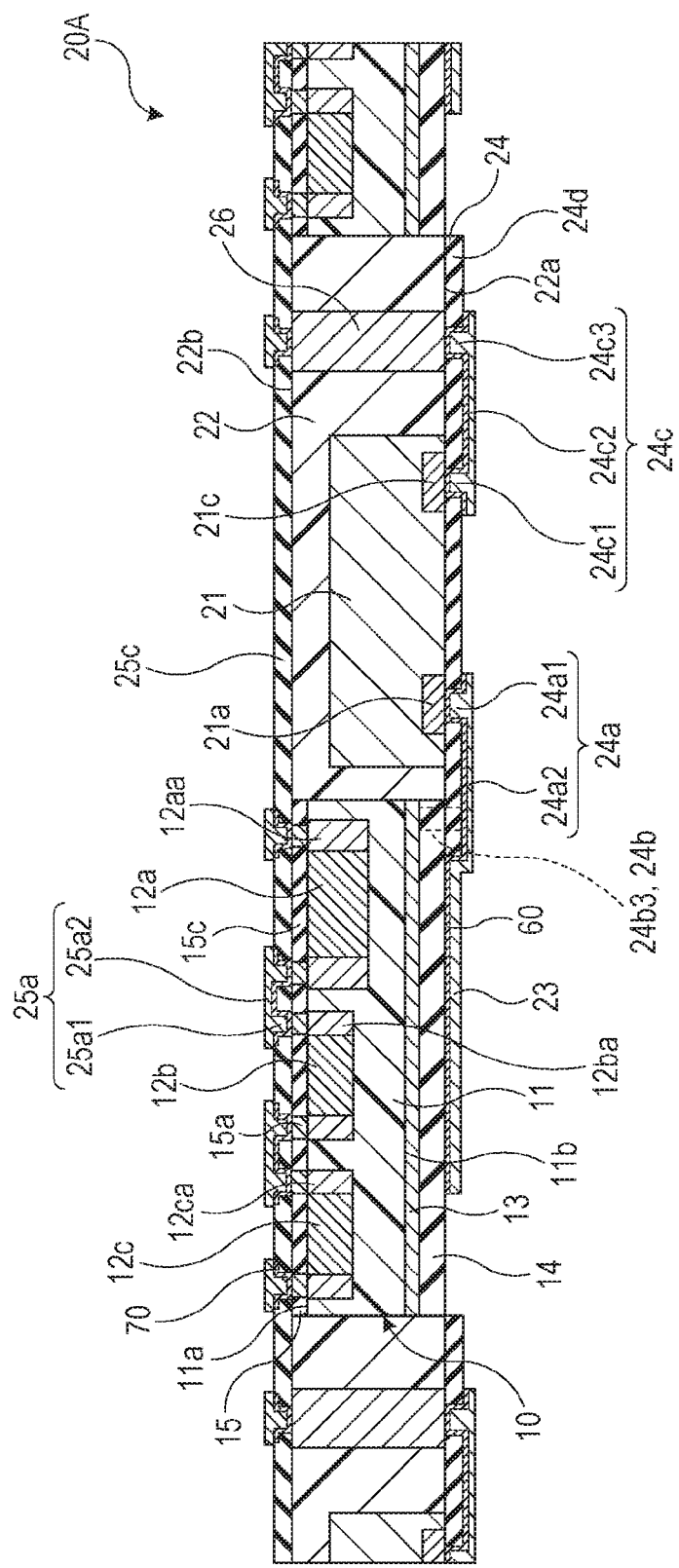
FIG. 24 is a view for explaining the example of the method of producing the electronic device according to the first embodiment (19)

Then, as illustrated in FIG. 24, the resist pattern 71 is removed, and portions of the seed layer 70, which become exposed by the removing, are removed. The resist pattern 71 is removed with acetone, for example. In the seed layer 70, which has a laminated structure including the titanium layer and the copper layer, the copper layer is removed by wet etching using an etching liquid including potassium sulfate, and then the titanium layer is removed by dry etching using an etching gas including tetrafluoromethane and oxygen. Thus, the conducting pattern 25a, which is electrically connected to the chip parts 12a, 12b, and 12c, and the through via 26 is obtained.

Figure 25:
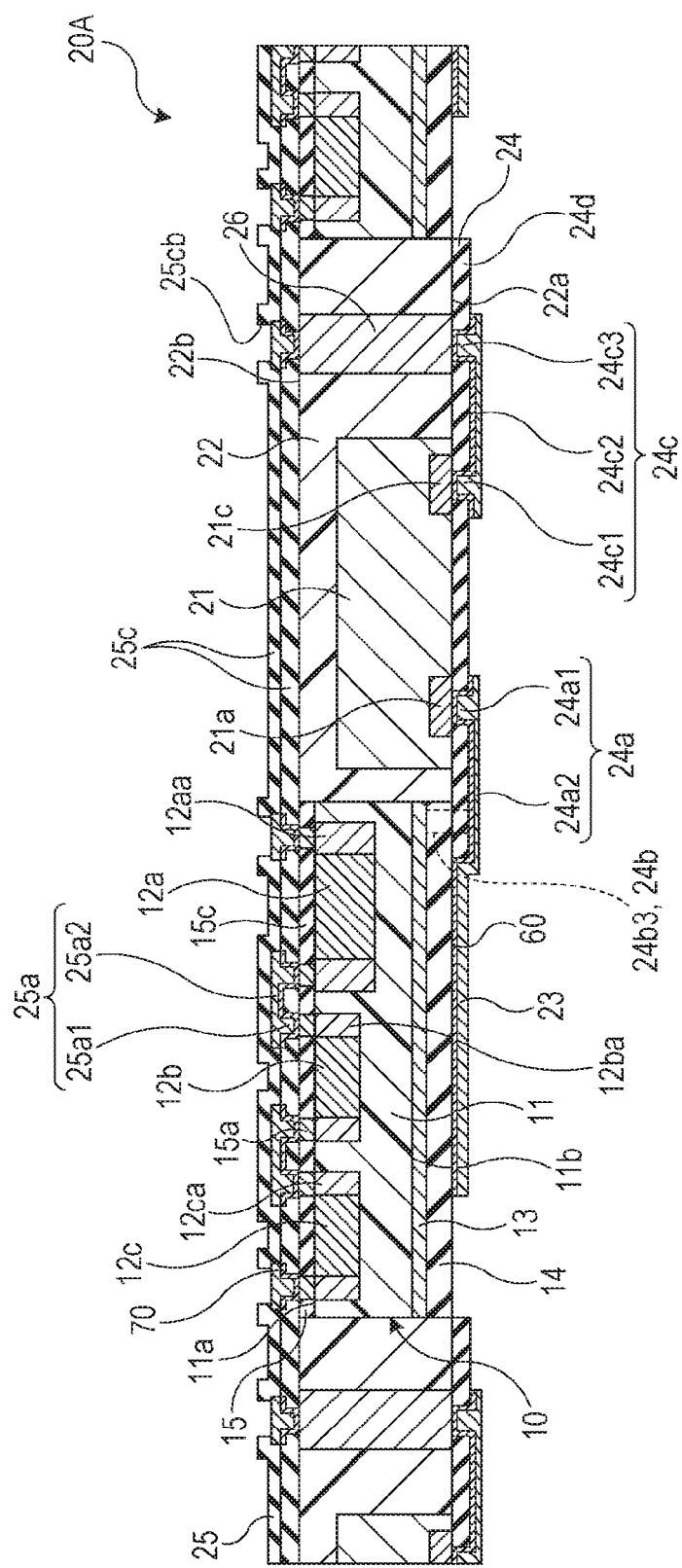
FIG. 25 is a view for explaining the example of the method of producing the electronic device according to the first embodiment (20)

Then, as illustrated in FIG. 25, the insulating layer 25c is formed. The insulating layer 25c is a portion of the insulating layer 25c illustrated in FIG. 4. The insulating layer 25c is formed by following steps. The insulating layer 25c is formed by following process. First, a photosensitive phenolic resin is applied to the insulating layer 25c illustrated in FIG. 24 s, for example, to a thickness of 10 μm and exposed to light. Then, the exposed photosensitive phenolic resin is developed with TMAH and cured at a temperature of 200° C. to 250° C., for example, at 200° C. As a result of the process, the insulating layer 25c as a surface layer of the wiring layer 25 is formed. In the thus obtained insulating layer 25c, an opening 25cb is formed so as to face a pad of the conductive pattern 25a connected to an external member.

The wiring layer 25 illustrated in FIG. 4 is formed on the surface 22b of the resin layer 22 of the pseudo wafer 20A by the steps described with reference To FIG. 20 to FIG. 25. Using the steps described above with reference to FIG. 11 to FIG. 25, the pseudo wafer 20A as a board is fabricated so as to include the structure 10 and the semiconductor chip 21, which are integrated with the resin layer 22, the wiring layer 24 formed on the surface 22a of the pseudo wafer 20A, and the wiring layer 25 formed on the surface 22b opposite the surface 22a.

Figure 26:
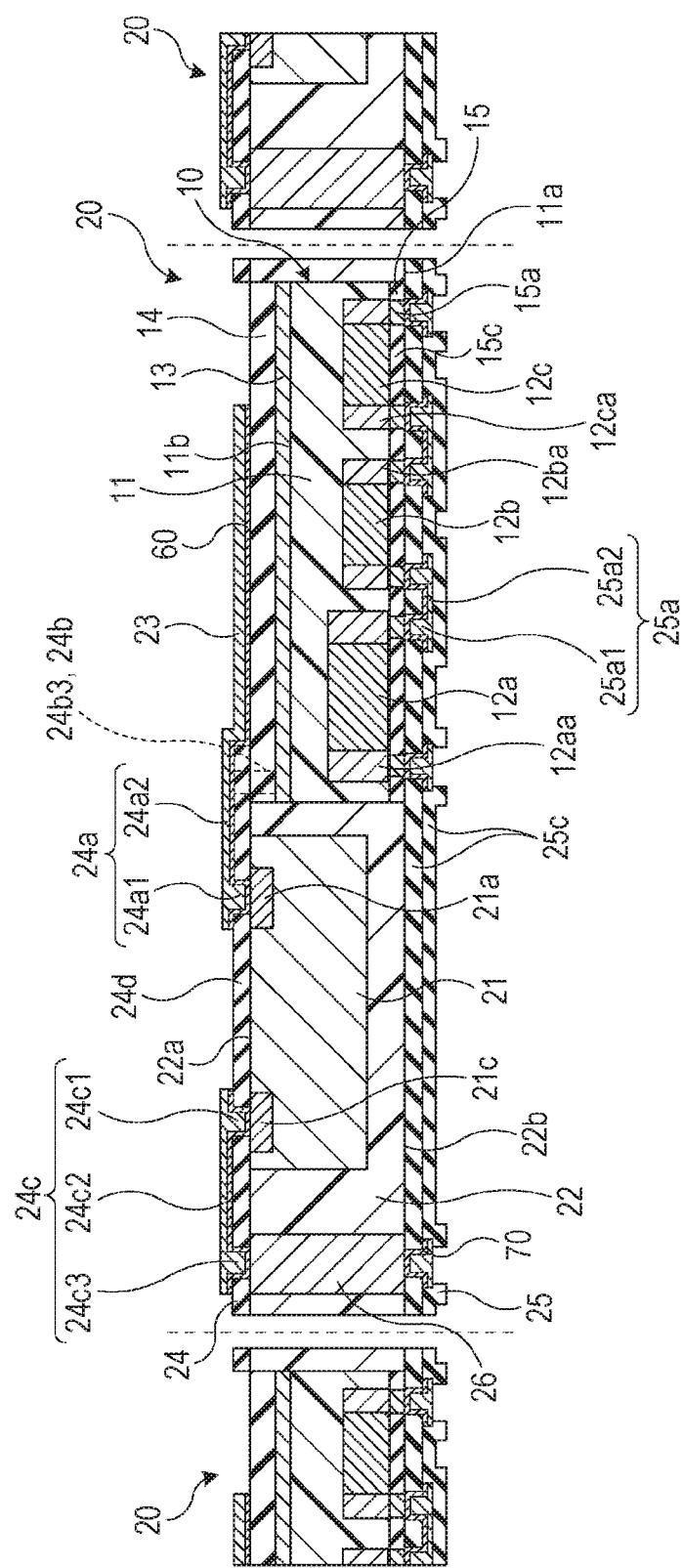
FIG. 26 is a view for explaining the example of the method of producing the electronic device according to the first embodiment (21)

As illustrated in FIG. 26, the pseudo wafer 20A may be diced with a diamond blade along a predetermined position indicated by a broken line in FIG. 26, for example. One pseudo wafer 20A is diced into a plurality of pieces each in the form of module 20 as an assembly as illustrated in FIG. 26.

The pad of the conductive pattern 25a, which is exposed on the insulating layer 25c of the module 20, is connected to the conductive pattern 31a of the circuit board 30 with the pieces of solder 40, as illustrated in FIG. 4. Thus, the electronic device 1 including the module 20 and the circuit board 30 electrically connected to each other as illustrated in FIG. 3 and FIG. 4 is produced.

When the module 20 has a thickness of 600 μm and an antenna including the reflector element 13, the insulating layer 14, and the radiating element 23 has a thickness of 200 μm, the module 20 is able to include the chip parts 12a, 12b, and 12c, and the via 15a of the wiring layer 15 which are height of up to about 400 μm.

As described above, FO-WLP is employed to produce the module 20.

By using FO-WLP technology for fabricating the module 20, it is allowed that the intervals among the chip parts 12a, 12b, and 12c, the interval between the structure 10 and the semiconductor chip 21, and the interval between the semiconductor chip 21 and the through via 26 become close to be connected electrically. Accordingly, the structure 10 or the module 20 in a small size may be obtained, as a result, the electronic device 1 in a small size may be obtained. In addition, this configuration reduces the length of the conductive pattern 24a (signal transmission line) connecting the semiconductor chip 21 and the radiating element 23, the length of the conductive pattern 24c connecting the semiconductor chip 21 and the through via 26, and the length of the conductive pattern 25a connected to the chip parts 12a, 12b, and 12c.

Figure 27:
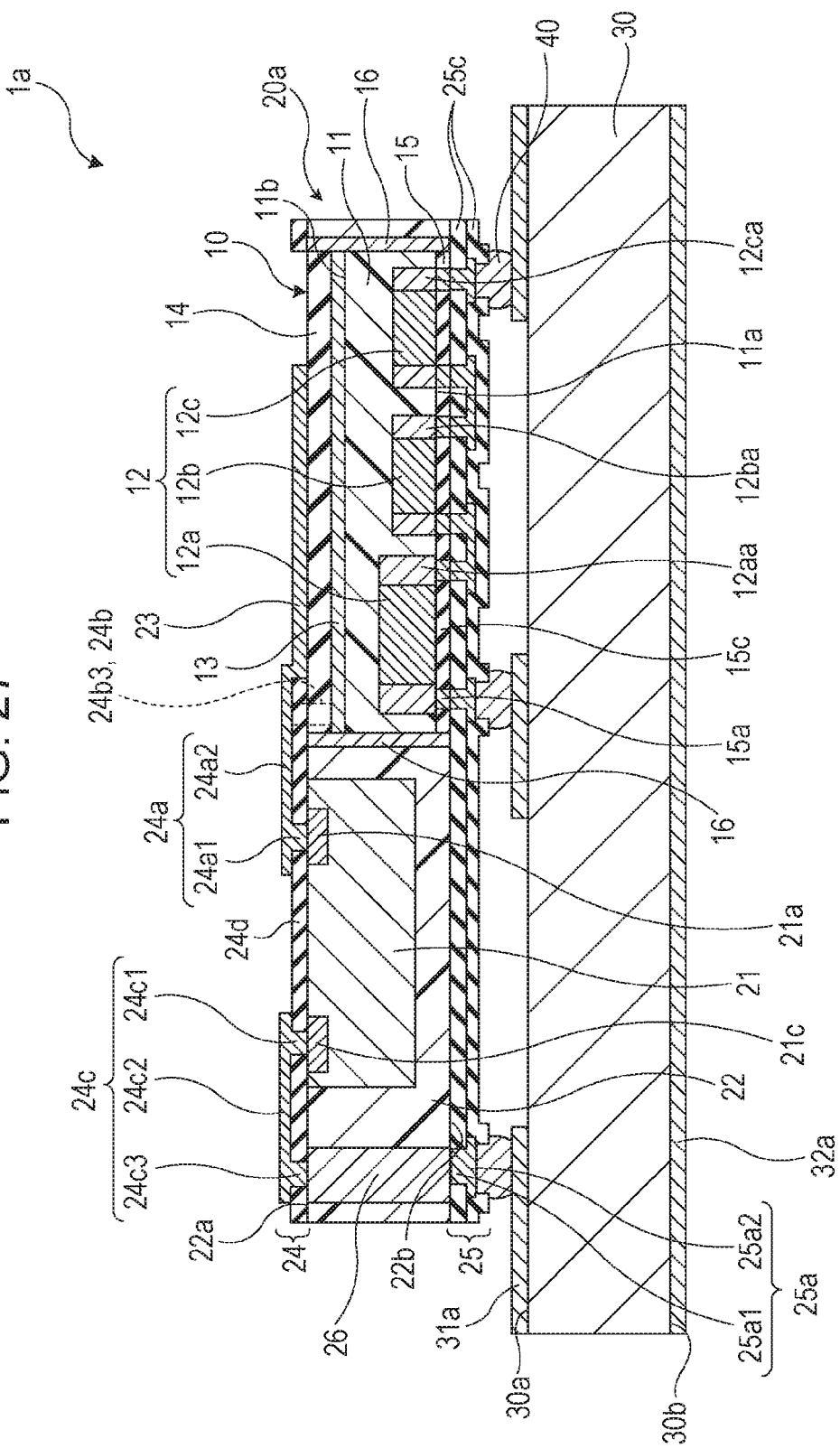
FIG. 27 is a view illustrating an example of an electronic device according to a second embodiment.

A second embodiment is described. FIG. 27 is a view illustrating an example of an electronic device according to the second embodiment. FIG. 27 illustrates a schematic cross-sectional view of an important portion in the electronic device as an example according to the second embodiment.

An electronic device 1a illustrated in FIG. 27 differs from the electronic device 1 according to the first embodiment in that a module 20a includes a conductor 16 on a side surface of the structure 10. The conductor 16 is disposed so as to cover side surfaces of the resin layer 11, the reflector element 13, and the insulating layer 14 in the structure 10. The conductor 16 covers at least one side surface of the structure 10, for example. The conductor 16 is electrically connected to the reflector element 13. The conductor 16 is formed of a metal material such as nickel (Ni), for example.

Figure 28:
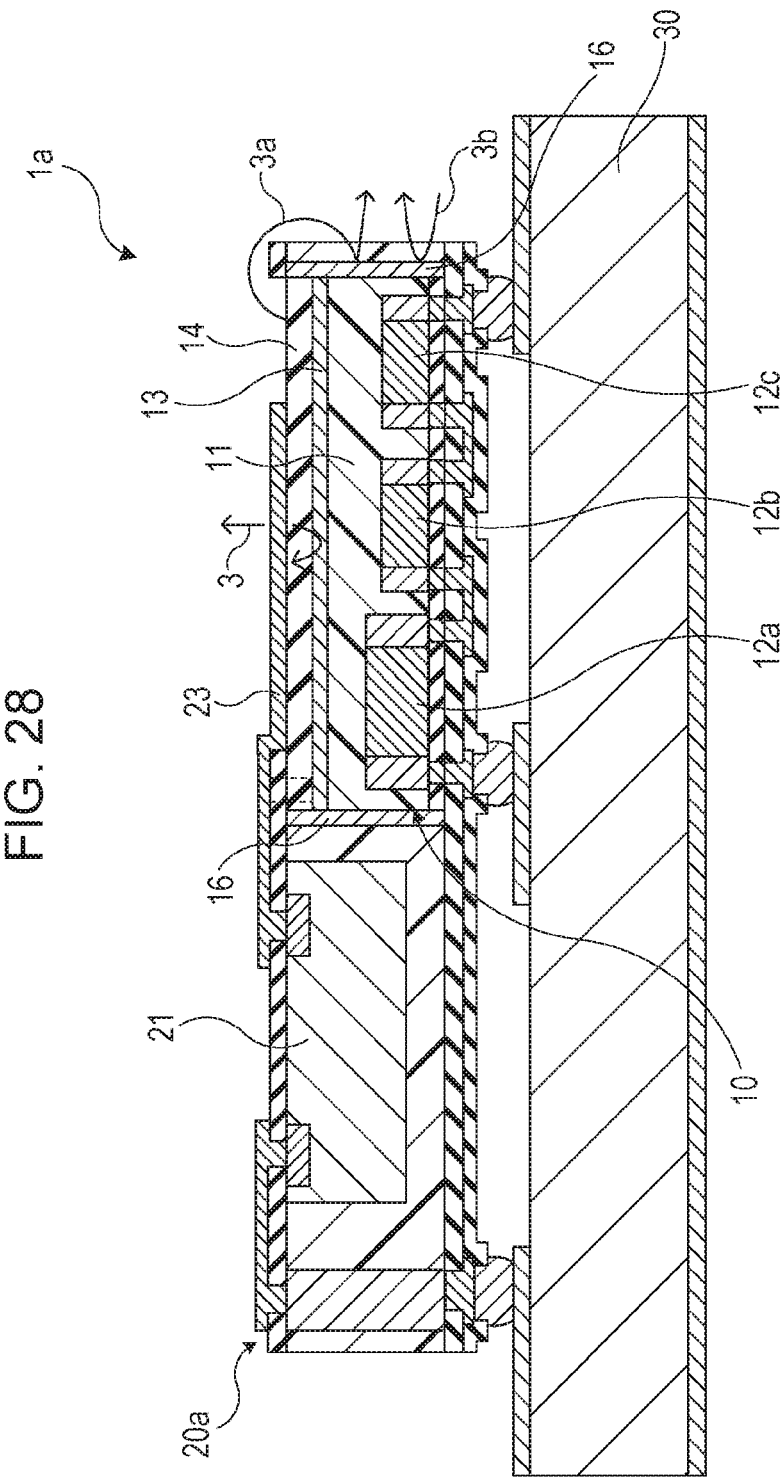
FIG. 28 is a view for explaining advantages of the electronic device according to the second embodiment.

FIG. 28 is a view for explaining advantages obtained by the electronic device according to the second embodiment. As illustrated in FIG. 28, the electronic device 1a according to the second embodiment includes the conductor 16 on the side surface of the structure 10, which is buried in the resin layer 22 together with the semiconductor chip 21.

In the electronic device 1a, the reflector element 13 blocks the radiation 3 from the radiating element 23 during transmission or reception of a signal, reducing influence of the radiation 3 on the chip parts 12a, 12b, and 12c. In addition, in the electronic device 1a, the conductor 16 blocks radiation 3a traveling from the radiating element 23 or the reflector element 13 toward the side surface of the structure 10. When the electronic device 1a includes another module near the module 20a, the conductor 16 also blocks radiation 3b from the other module. When the electronic device 1a includes another module near the module 20a, the conductor 16 also blocks radiation 3b from the other module. The conductor 16 on the side surface of the structure 10 reduces the influence of the radiation 3a and 3b on the chip parts 12a, 12b, and 12c. The conductor 16 is preferably disposed to cover the entire side surface of the structure 10 so as to effectively reduce the influence of the radiation 3a traveling toward the side surface as described above or the influence of the radiation 3b from outside on the chip parts 12a, 12b, and 12c.

In the electronic device 1a according to the second embodiment, the generation of noise in the circuit including the semiconductor chip 21, the chip parts 12a, 12b, and 12c, and the circuit board 30 is more effectively reduced.

Figure 29A:
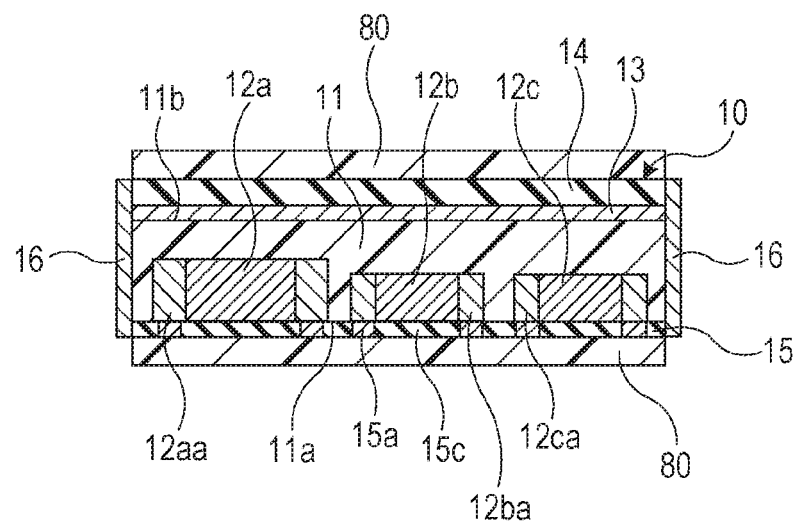
FIGS. 29A and 29B are views for explaining an example of a method of producing a structure according to the second embodiment.
Figure 29B:
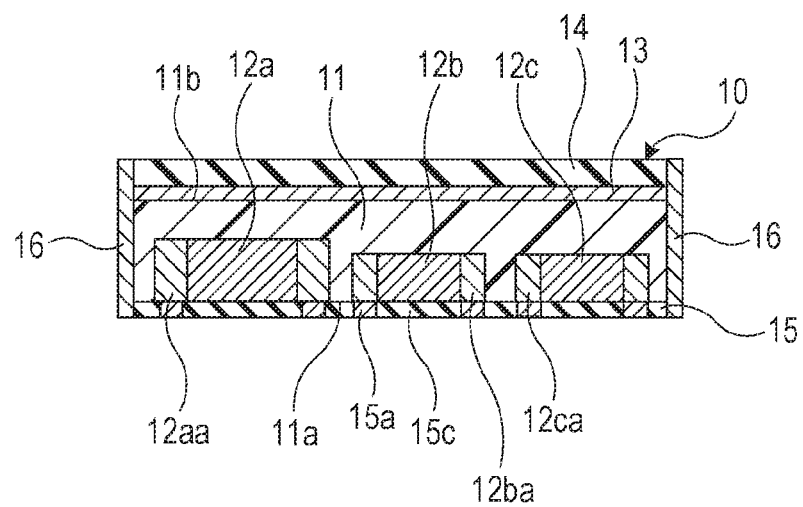

The above-described conductor 16 is formed on the side surface of the structure 10 by a method illustrated in FIG. 29A and FIG. 29B, for example. FIGS. 29A and 28B are views for explaining an example of a method of producing the structure according to the second embodiment. Each of FIG. 29A and FIG. 29B illustrates schematically the important cross section in corresponding step in the fabricating process.

The structure 10 as individually diced one is produced according to processes explained with reference to FIG. 6 to FIG. 10 for the first embodiment described above. Specifically, there is formed the pseudo wafer 10A which includes the chip parts 12a, 12b, and 12c, the resin layer 11 covering the chip parts 12a, 12b, and 12c, the wiring layer 15 on the surface 11a of the resin layer 11, the reflector element 13 on the surface 11b of the resin layer 11, and the insulating layer 14 on the reflector element 13. Then, the formed pseudo wafer 10A is diced into pieces.

Then, as illustrated in FIG. 29A, a resist layer 80 is formed on each of the wiring layer 15 and the insulating layer 14 of the structure 10, which is one of the diced pieces. After the formation of the resist layers 80, the conductor 16 is formed on the side surfaces of the structure 10, which is not covered with the resist layers 80, by non-electrolytic plating with the same material as the conductor 16, for example, by non-electrolytic nickel plating.

After the formation of the conductor 16, the resist layers 80 are removed, as illustrated in FIG. 29B. The resist layers 80 are removed with acetone, for example. As a result, the structure 10 including the conductor 16 on the side surfaces is produced.

Then, the steps in the first embodiment described with reference to FIG. 11 to FIG. 26 are performed by using the structure 10 including the conductor 16 on the side surfaces so as to produce the module 20a illustrated in FIG. 27. The thus produced module 20a is connected to the circuit board 30 with the pieces of solder 40. Thus, the electronic device 1a as illustrated in FIG. 27 including the module 20a and the circuit board 30, which are electrically connected to each other, is produced.

Figure 30:
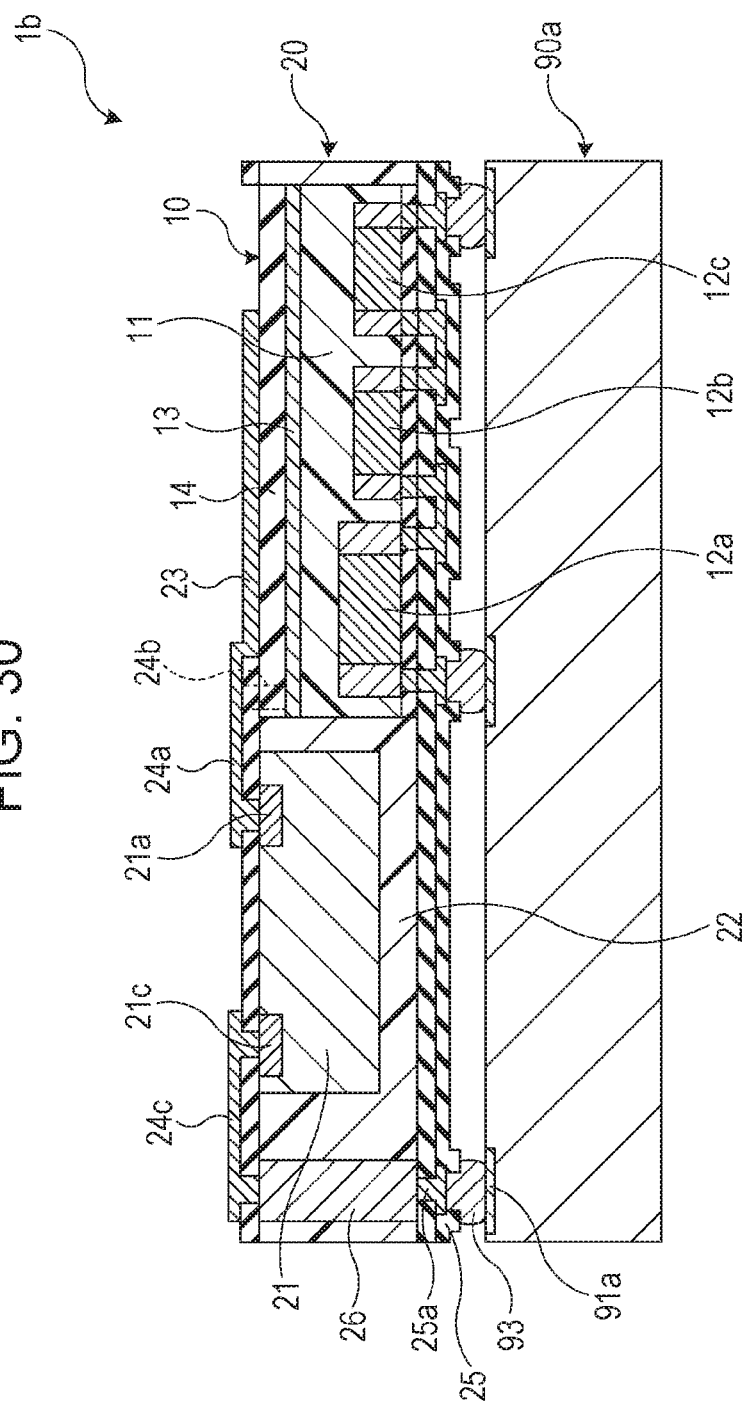
FIG. 30 is a view illustrating an example of an electronic device according to a third embodiment (1)
Figure 31:
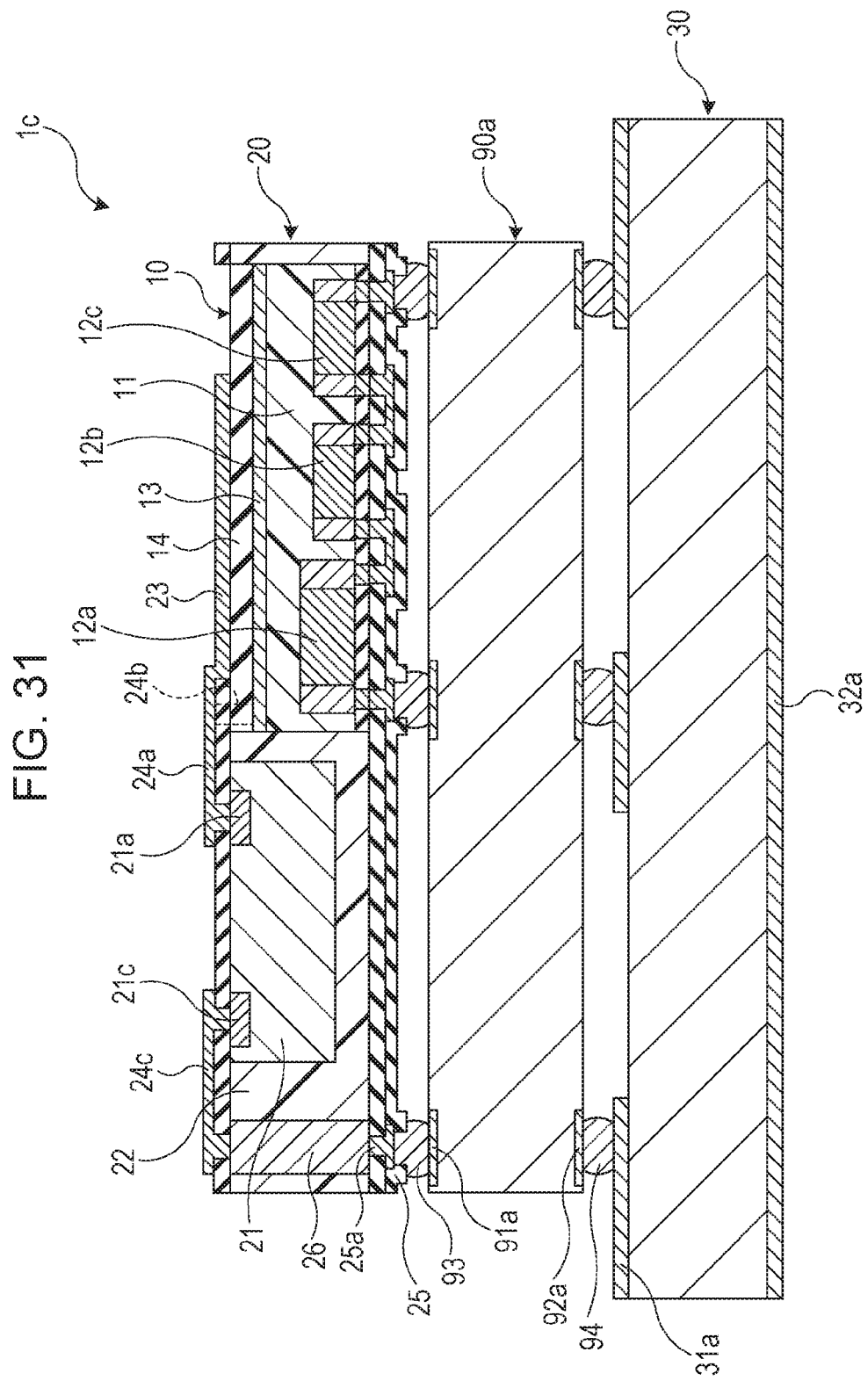
FIG. 31 is a view illustrating the example of the electronic device according to the third embodiment (2)

Hereinafter, a third embodiment is described. FIG. 30 and FIG. 31 are views illustrating an example of an electronic device according to the third embodiment. Each of FIG. 30 and FIG. 31 illustrates a schematic cross-sectional view of an important portion in the electronic device as an example according to the third embodiment.

An electronic device 1b according to the third embodiment illustrated in FIG. 30 differs from the electronic device 1 according to the first embodiment in that the module 20 including the configuration described in the first embodiment, for example, is disposed on a semiconductor apparatus 90a (board).

The semiconductor apparatus 90a is a semiconductor chip, a semiconductor package including a semiconductor chip disposed on a circuit board or a package board, a module formed by WLP in the same manner as described above, or a pseudo System on a Chip (SoC). A pad of the conductive pattern 25a of the wiring layer 25 of the module 20 is connected with pieces of solder 93a to conductive pattern 91a, which is positioned on the surface of the semiconductor apparatus 90a facing the module 20. Thus, the module 20 and the semiconductor apparatus 90a are electrically connected to each other.

As described above, the module 20 may be mounted on the semiconductor apparatus 90a of any type instead of the circuit board 30. As an electronic device 1c illustrated in FIG. 31A, a laminated body including the module 20 and the semiconductor apparatus 90a may be disposed on the circuit board 30. A conductive pattern 92a on the semiconductor apparatus 90a and the conductive pattern 31a on the surface of the circuit board 30 facing the semiconductor apparatus 90a are connected, for example, with pieces of solder 94. As a result, the laminated body, which includes the module 20 and the semiconductor apparatus 90a, and the circuit board 30 are electrically connected to each other.

In this embodiment, the module 20 described in the first embodiment is used as an example. However, the module 20a described in the second embodiment may be mounted on the semiconductor apparatus 90a or a laminated body including the module 20a and the semiconductor apparatus 90a may be mounted on the circuit board 30.

Figure 32:
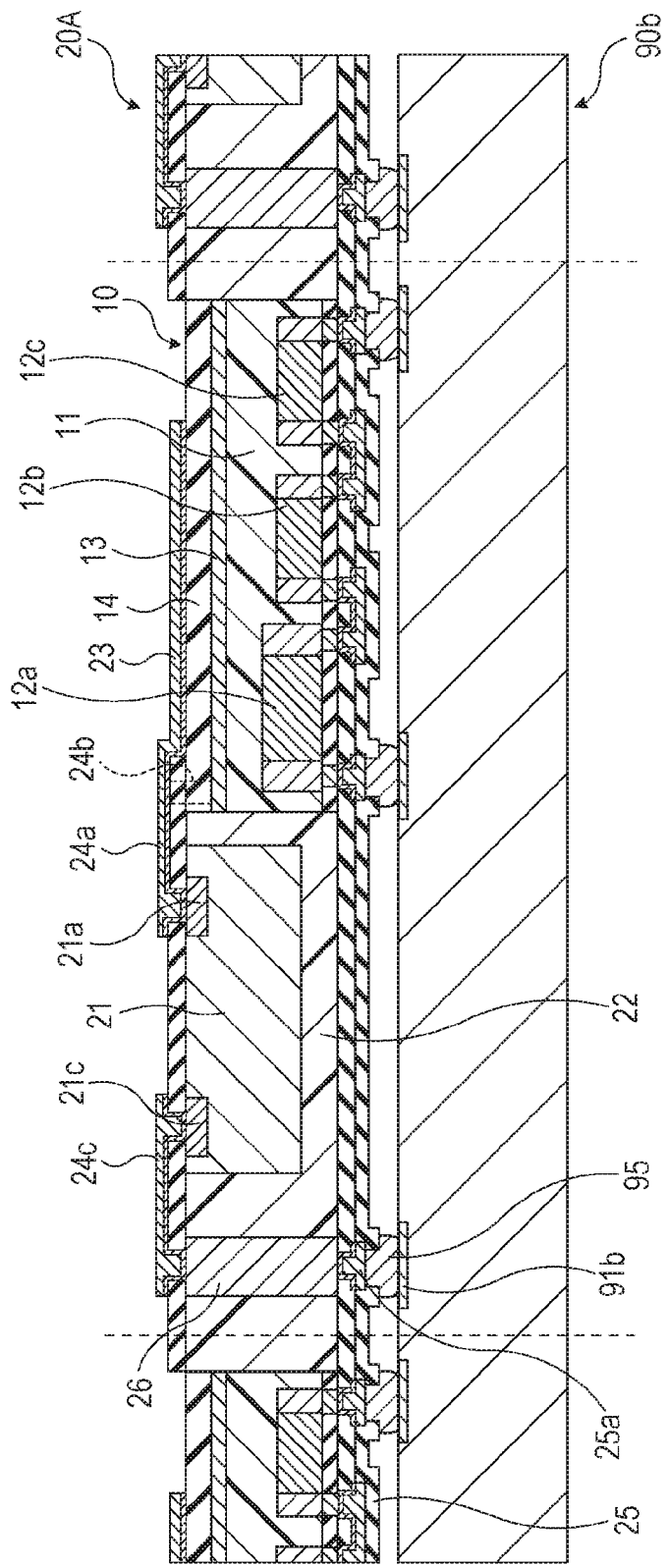
FIG. 32 is a view illustrating an example of an electronic device according to a fourth embodiment.

Hereinafter, a fourth embodiment is described. FIG. 32 is a view illustrating an example of an electronic device according to the fourth embodiment. In FIG. 32, main components of the example of the electronic device according to the fourth embodiment are schematically illustrated in cross section. FIG. 32 illustrates a schematic cross-sectional view of an important portion in the electronic device as an example according to the third embodiment.

As illustrated in FIG. 32, the pseudo wafer 20A illustrated in FIG. 25 described in the first embodiment may be connected to a board 90b before diced into pieces. The board 90b is a semiconductor wafer including a semiconductor chip, a pseudo wafer formed by WLP as described above, or a circuit board. The board 90b includes components including semiconductor devices such as semiconductor chips or pseudo SoCs, and circuit boards at positions corresponding to the modules 20 included in the pseudo wafer 20A connected to the board 90b, for example. The pad of the conductive pattern 25a of the wiring layer 25 of the pseudo wafer 20A is connected with pieces of solder 95 to the conductive pattern 91b on a surface of the board 90b facing the pseudo wafer 20A. As a result, the pseudo wafer 20A and the board 90b are electrically connected to each other.

As described above, the pseudo wafer 20A may be connected to the board 90b of any type before diced into pieces. After the pseudo wafer 20A is connected to the board 90b, the pseudo wafer 20A and the board 90b connected to each other are diced at a position indicated by a broken line in FIG. 32, for example. As a result of the dicing, diced electronic devices in each of which the module 20 is mounted on the semiconductor apparatus and the circuit board (components included in the board 90b before the dicing) are produced.

Herein, the pseudo wafer 20A including the module 20 described in the first embodiment is used as an example. However, a pseudo wafer before diced in the steps of producing the module 20a described in the second embodiment may be connected to the board 90b or may be diced before connected to the board 90b.

According to the above-described first to fourth embodiments, the modules 20 and 20a having antenna and improved noise immunity and the electronic devices 1, 1a, 1b, 1c including the modules 20 and 20a are achieved, suppressing increase of their sizes.

The above-described modules 20 and 20a and the electronic devices 1, 1a, 1b, and 1c may be applicable to devices, which use a high-frequency signal, such as a high-speed communication device, an imaging apparatus, a material analyzer, a structure analyzer, and an automotive radar, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic device comprising:
 a structure including
  a first wiring layer,
  an electronic component disposed on the first wiring layer,
  a first resin layer that covers the electronic component, and a reflector element of an antenna disposed on the first resin layer;
a semiconductor device;
a second resin layer that covers the structure and the semiconductor device;
an insulating layer disposed on the reflector element and the semiconductor device; and
a radiating element of the antenna disposed on the insulating layer over the reflector element,
wherein a terminal of the semiconductor device is exposed from the insulating layer, and
wherein a wiring is disposed on the insulating layer and electrically coupled the terminal of the semiconductor device and the radiating element.

2. The electronic device according to claim 1, further comprising a conductor disposed on a side surface of the structure.

3. The electronic device according to claim 2, wherein the conductor is electrically connected to the reflector element.

4. The electronic device according to claim 1, wherein the insulating layer and a second terminal of the semiconductor device are exposed on a third surface of the second resin layer, and a first wiring layer including a first conductive member is disposed on the third surface, the first conductive member electrically connecting the radiating element and the second terminal to each other.

5. The electronic device according to claim 4, further comprising a through via extending through the second resin layer, wherein
a third terminal of the semiconductor device is exposed on the third surface of the second resin layer, and
the first wiring layer further includes a second conductive member that electrically connects the through via and the third terminal of the semiconductor device to each other.

6. The electronic device according to claim 4, further comprising a second wiring layer on a fourth surface of the second resin layer opposite the third surface, the second wiring layer being electrically connected to the electronic component and the semiconductor device.

7. The electronic device according to claim 6, further comprising a board disposed adjacent to the second resin layer and electrically connected to the fourth surface of the second wiring layer.

* * * * *